(12) United States Patent
Mochizuki et al.

(10) Patent No.: US 7,528,620 B2
(45) Date of Patent: May 5, 2009

(54) PROBE CARD TRANSFER ASSIST APPARATUS AND INSPECTION EQUIPMENT USING SAME

(75) Inventors: Chiaki Mochizuki, Nirasaki (JP); Munetoshi Nagasaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/563,427

(22) Filed: Nov. 27, 2006

(65) Prior Publication Data
US 2007/0126441 A1 Jun. 7, 2007

(30) Foreign Application Priority Data
Nov. 30, 2005 (JP) ............... 2005-345047
Nov. 30, 2005 (JP) ............... 2005-345048

(51) Int. Cl.
G01R 31/02 (2006.01)
G01R 31/28 (2006.01)

(52) U.S. Cl. ............................. 324/765; 324/158.1
(58) Field of Classification Search ......... 324/754–755, 324/758
See application file for complete search history.

(56) References Cited
U.S. PATENT DOCUMENTS

| | | | |
|---|---|---|---|
| 5,528,158 A * | 6/1996 | Sinsheimer et al. ......... | 324/758 |
| 5,640,100 A * | 6/1997 | Yamagata et al. ........... | 324/754 |
| 6,374,982 B1 * | 4/2002 | Cohen et al. .............. | 198/346.2 |
| 6,669,038 B1 * | 12/2003 | Zingerman ................... | 212/242 |
| 6,822,464 B2 * | 11/2004 | Suzuki ....................... | 324/754 |
| 6,968,963 B1 * | 11/2005 | Zakula et al. ............... | 212/270 |
| 2003/0178987 A1 * | 9/2003 | Suzuki ..................... | 324/158.1 |
| 2004/0183525 A1 * | 9/2004 | Amemiya et al. ......... | 324/158.1 |
| 2007/0063720 A1 * | 3/2007 | Nagasaka et al. ........... | 324/754 |

* cited by examiner

Primary Examiner—Ha Tran T Nguyen
Assistant Examiner—Joshua Benitez
(74) Attorney, Agent, or Firm—Oblon, Spivak, McClelland, Maier & Neustadt, P.C.

(57) ABSTRACT

A probe card transfer assist apparatus for assisting an operation of transferring a probe card employed in an electrical inspection apparatus includes a holding unit for holding a pair of grips of the probe card wherein the grips are supported by being placed onto or suspended by the holding unit; a supporting unit for movably supporting the holding unit; and an elevation mechanism for moving the supporting unit up and down. Further, an inspecting equipment is provided with the probe card transfer assist apparatus having a holding unit for holding a pair of grips of the probe card wherein the grips are supported by being placed onto or suspended by the holding unit; a supporting unit for movably supporting the holding unit; and an elevation mechanism for moving the supporting unit up and down.

26 Claims, 15 Drawing Sheets

PROBE CARD TRANSFER ASSIST APPARATUS AND INSPECTION EQUIPMENT USING SAME

FIELD OF THE INVENTION

The present invention relates to an inspection equipment and method, the equipment including a plurality of inspection apparatuses, each for performing an electrical characteristics inspection of an object-to-be-inspected such as a wafer or the like by employing a probe card; and, more particularly, to a probe card transfer assist apparatus, which facilitates operations of transferring a probe card between an inspection apparatus and a transfer vehicle in the inspection equipment, and an inspection equipment and method employing same.

BACKGROUND OF THE INVENTION

This type of inspection apparatus includes for example, as shown in FIG. 15, a loader chamber 1 for transferring an object-to-be-inspected (e.g., a wafer) W and a prober chamber 2, disposed adjacent to the loader chamber 1, for performing an electrical characteristics inspection of the wafer W loaded therein from the loader chamber 1. The prober chamber 2, as shown in FIG. 15, includes a mounting table (wafer chuck) 3 for mounting thereon a wafer and disposed in a manner capable of moving in the directions of X, Y, Z and θ; a probe card 4 having a card holder and disposed at a location above the wafer chuck 3; and a clamp mechanism 5 for holding the probe card 4. Within the prober chamber 2, by moving the wafer chuck 3 in the directions of X, Y, Z and θ, an alignment of the wafer W with probe pins 4A of the probe card 4 is performed with an alignment device 6. Therefore, the electrical characteristics inspection is performed on the wafer W while index transporting the wafer W. In addition, the alignment device 6 includes an upper camera 6A and a lower camera 6B. The reference character T represents a test head.

For mounting and removing the probe card 4 to and from the clamp mechanism 5 placed within the prober chamber 2, there is provided, for example, a probe card carrying mechanism disclosed in Japanese Patent Laid-open Application No. 2001-24039 which was filed by the present assignee. The card carrying mechanism, as shown in FIG. 16, includes the wafer chuck 3 and a transfer unit 7 which transfers the probe card 4 to and from the wafer chuck 3. The transfer unit 7, as shown in FIG. 16, includes an adapter 8 having the card holder, the adapter 8 holding the probe card 4 in a freely attachable and removable manner; a bifurcated fork shaped arm 9 for holding the adapter 8 in a freely attachable and removable manner; a pair of guide rails 10 which guide the probe card 4 to a transfer location by sliding the arm 9 inwards in the direction of an arrow A; and an arm support 11 on which the guide rails 10 are fixed. Further, the adapter 8 holding the probe card 4 thereon is transferred between the arm 9 and an adapter support 12 disposed at the wafer chuck 3 Moreover, when transferring the probe card 4 to the clamp mechanism 5 to be held thereby by employing the card carrying mechanism, an operator for example positions the probe card 4 onto the transfer unit 7, and then transfers the probe card 4 to a position directly below the clamp mechanism 5 by using the card carrying mechanism. Thereafter, the operator elevates the wafer chuck 3 from the above-mentioned position, and then securely places the probe card 4 to a main body of the inspection apparatus with the clamp mechanism 5. Further, as illustrated in FIG. 16, the reference numeral 13 represents a receiving part which receives the transfer unit 7 folded in an opposite direction of an arrow B.

However, in case of positioning the probe card 4 onto the card carrying mechanism, the operator is required to physically move the probe card 4 to the inspection apparatus from a maintenance shelf; or required to move the probe card 4 to the inspection apparatus from the maintenance shelf by using a transfer vehicle or the like, and then transfer the probe card 4 from the transfer vehicle to the card carrying mechanism in order to install the probe card 4 in the inspecting apparatus 52, for example.

Yet, as a consequence of a recent scaling-up of the probe card 4 causing its weight to increase, for example, to 15-25 kg, a strong force is needed to move the probe card 4 from the transfer vehicle to the card carrying mechanism. Furthermore, in case of lifting the probe card 4 only with hands, the grip portions are limited, thereby giving the operator an enormous amount of burden in the process.

SUMMARY OF THE INVENTION

It is, therefore, an object of the present invention to provide a probe card transfer assist apparatus capable of reducing the burden of operator and allowing easy transferring of the probe card even for handling a heavy probe card, and provide an inspection equipment and method employing same.

In accordance with one aspect of the present invention, there is provided a probe card transfer assist apparatus for assisting an operation of transferring a probe card employed in an electrical inspection apparatus, the probe card transfer assist apparatus including a holding unit for holding a pair of grips of the probe card wherein the grips are supported by being placed onto or suspended by the holding unit; a supporting unit for movably supporting the holding unit; and an elevation mechanism for moving the supporting unit up and down.

Further, the holding unit may include grooves for placing therein the grips.

Further, the holding unit may be provided with release prevention members for preventing a release of the grips from the holding unit.

Further, each of the release prevention members may include a lever attached at one of the end portions of the holding unit, the lever is allowed to be raised and folded.

Further, each of the release prevention members may include a flexible member attached at one of the end portions of the holding unit to be protruded above the grooves.

Further, the holding unit may include a first plate member having the grooves; a second plate member disposed above the first plate member and for holding the first plate member while allowing the first plate member to be moved up and down; and a sensor for detecting a change of a distance between the first and the second plate member.

Further, the holding unit may be attached to an extensible and contractible arm protruded from the supporting unit.

Further, the arm may be provided with an elevation unit for moving the holding unit up and down.

Further, the elevation mechanism for the supporting unit may include a cylinder device for moving the arm up and down; a valve for opening and closing a line supplying a driving fluid to the cylinder device; a pressure sensor for detecting a pressure of the driving fluid; a input terminal for inputting in advance a weight of the probe card for the regulator to control the pressure of the driving fluid according to the weight; and a regulator for controlling the pressure of the driving fluid.

Further, the elevation mechanism for the supporting unit may be configured to provide a supplementary force in a direction where the probe card is moved upwardly.

Further, the supplementary force may be configured to be varied according to the weight of the probe card.

Further, the probe card transfer assist apparatus may be disposed at the inspection apparatus.

Further, the probe card transfer assist apparatus may be located between the inspection apparatus and a transfer unit for transferring the probe card to and from the inspection apparatus, when assisting the operation of transferring the probe card between the inspection apparatus and the transfer means.

Further, the transfer unit may be a transfer vehicle.

Further, the grips may be supported by being suspended by the holding unit with wire-shaped members.

Further, the holding unit may include a first member having the wire-shaped members attached thereto, a second member disposed above the first member and for holding the first member while allowing the first member to be moved up and down, and a sensor for detecting a change of a distance between the first and the second members.

In accordance with another aspect of the present invention, there is provided an inspecting equipment comprising a probe card transfer assist apparatus for assisting an operation of transferring a probe card employed in an electrical inspection apparatus, the probe card transfer assist apparatus including a holding unit for holding a pair of grips of the probe card wherein the grips are supported by being placed onto or suspended by the holding unit; a supporting unit for movably supporting the holding unit; and an elevation mechanism for moving the supporting unit up and down.

Further, the holding unit may include grooves for placing therein the grips.

Further, the holding unit may be provided with release prevention members for preventing a release of the grips from the holding unit.

Further, each of the release prevention members may include a lever attached at one of the end portions of the holding unit, the lever is allowed to be raised and folded.

Further, each of the release prevention members may include a flexible member attached at one of the end portions of the holding unit to be protruded above the grooves.

Further, the holding unit may include a first plate member having the grooves; a second plate member disposed above the first plate member and for holding the first plate member while allowing the first plate member to be moved up and down; and a sensor for detecting a change of a distance between the first and the second plate member.

Further, the holding unit may be attached to an extensible and contractible arm protruded from the supporting unit.

Further, the arm may be provided with an elevation unit for moving the holding unit up and down.

Further, the elevation mechanism for the supporting unit may include a cylinder device for moving the arm up and down; a valve for opening and closing a line supplying a driving fluid to the cylinder device; a pressure sensor for detecting a pressure of the driving fluid; a input terminal for inputting in advance a weight of the probe card for the regulator to control the pressure of the driving fluid according to the weight; and a regulator for controlling the pressure of the driving fluid.

Further, the elevation mechanism for the supporting unit may be configured to provide a supplementary force in a direction where the probe card is moved upwardly.

Further, the supplementary force may be configured to be varied according to the weight of the probe card.

Further, the probe card transfer assist apparatus may be disposed at the inspection apparatus.

Further, the probe card transfer assist apparatus may be located between the inspection apparatus and a transfer unit for transferring the probe card to and from the inspection apparatus, when assisting the operation of transferring the probe card between the inspection apparatus and the transfer means.

Further, the transfer unit may be a transfer vehicle.

Further, the grips may be supported by being suspended by the holding unit with wire-shaped members.

Further, the holding unit may include a first member having the wire-shaped members attached thereto, a second member disposed above the first member and for holding the first member while allowing the first member to be moved up and down, and a sensor for detecting a change of a distance between the first and the second members.

Therefore, in accordance with the claims of the present invention, there can be provided the probe card transfer assist apparatus, thereby reducing the burden of operator even in case of handling probe cards heavy in weight and allowing easy transfers of the probe cards; and an inspection equipment and method.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, there will be described preferred embodiments of the present invention with reference to the accompanying drawings.

First Embodiment

Figure 1:
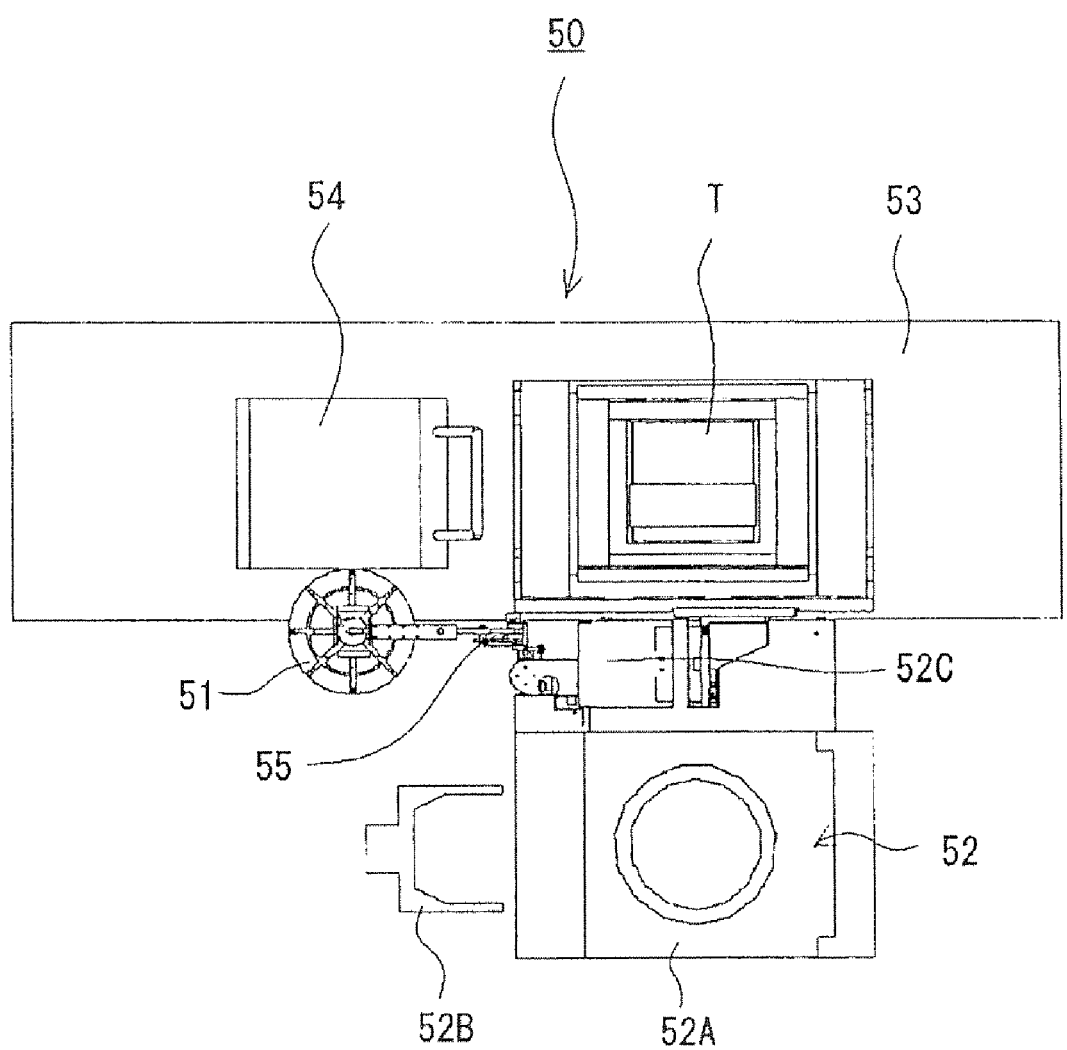
FIG. 1 is a top view illustrating a first embodiment of an inspecting equipment in the present invention.

As shown in FIG. 1, an inspection equipment 50 of the present invention, for example, includes one or more inspection apparatuses 52, each employing a probe card 51 for performing an electrical characteristics inspection of an object-to-be-inspected (e.g., a wafer) (not shown); a transfer vehicle 54 for transferring the probe card 51 along a passageway 53 where the inspection apparatuses 52 are placed; and a probe card transfer assist apparatus 55, which is adapted to assist an operation of transferring the probe card 51 between the transfer vehicle 54 and a card transfer unit 52B disposed at an apparatus main body 52A of the illustrated inspection apparatus 52, the apparatus main body 52A of each inspection apparatus 52 being provided with one card transfer unit 52B. The inspection apparatus 52 shown in FIG. 1 illustrates a state where a test head T is rotated to ward the passageway 53 by a rotational driving mechanism 52C. A plurality of probe cards 51 is accommodated in a maintenance shelf (not shown). Further, for exchanging the probe cards 51 for example, the probe cards 51 are transferred by the transfer vehicle 54 between the maintenance shelf and a plurality of the inspection apparatuses 52. It is noted that only one of the inspection apparatuses 52 is illustrated in FIG. 1.

However, as the aforementioned probe cards 51 have been scaled-up and increased in weight due to the result of a recent trend of increasing wafer diameter or highly integrated IC chips or the like, much effort and burden is now placed on not only to an operator who hand-carries such probe cards 51, but also to an operator who performs an operation of transferring the probe card 51 between the transfer vehicle 54 and the card transfer unit 52B of the inspection apparatus 52. However, in this preferred embodiment of the present invention, the burden of an operator is reduced in the manners as follows: when the operator transfers the probe cards 51 between the maintenance shelf and a plurality of the inspection apparatuses 52, the transfer vehicle 54 is employed. Further, the probe card transfer assist apparatus 55 is employed for transferring the probe card 51 between the transfer vehicle 54 and the card transfer unit 52B of the inspection apparatus 52.

It is also noted that in case of employing the probe card transfer assist apparatus 55, physical labor can be greatly reduced in reality just by only holding and removing the probe card 51 at the card transfer unit 52B or the transfer vehicle 54 by a holder of the probe card transfer assist apparatus 55. Further, in case of transferring the probe card 51 between the transfer vehicle 54 and the card transfer unit 52B of the inspection apparatus 52, the probe card 51 is transferred between the transfer vehicle 54 and the card transfer unit 52B of the inspection apparatus 52 as directed by the operator. In addition, the transfer vehicle 54 includes a plurality of vertically arranged levels of extractable shelves prepared to receive a plurality of probe cards 51, and the shelves are configured to accommodate trays having thereon the probe cards 51.

Figure 2A:
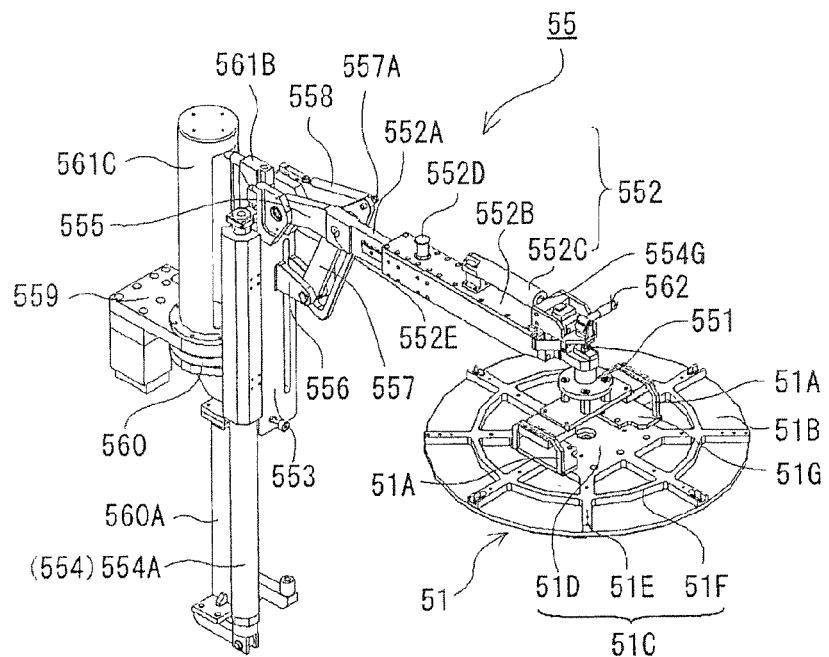
FIG. 2A is a perspective view illustrating major marts of a probe card transfer assist apparatus applied to the inspecting equipment, and 2B is a side view thereof.
Figure 2B:
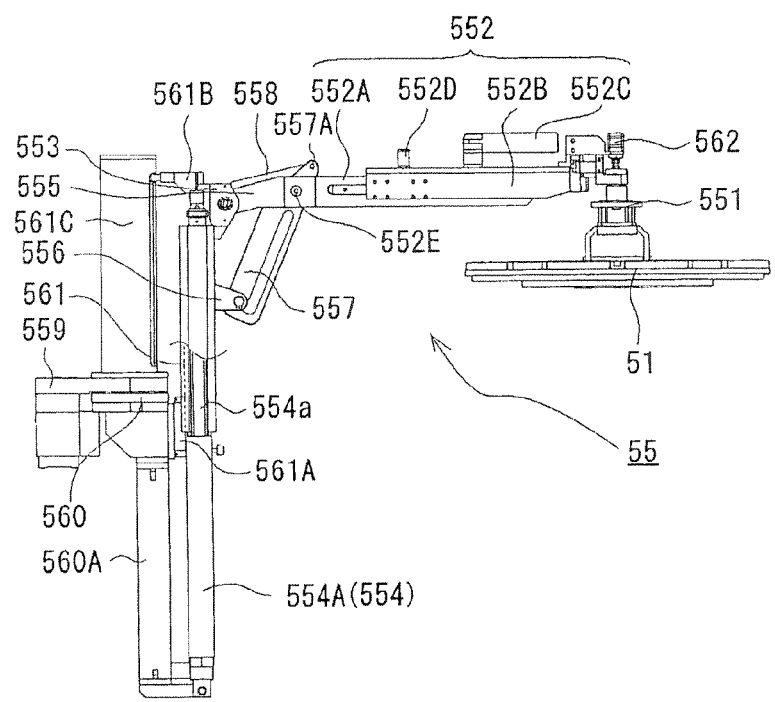

The probe card transfer assist apparatus 55 is disposed at one side of the inspection apparatus 52 and includes, as shown in FIGS. 2A and 2B, a holder 551 for holding the probe card 51; an extensible and contractible arm 552, the holder 551 being disposed at an end portion of the arm 552; a rotatable supporting unit 553 capable of supporting the arm 552; and an air cylinder 554A included in an elevation driving unit 554 which moves the probe card 51 up and down with the supporting unit 553 in accordance with a specified weight of each probe card 51.

The arm 552 includes, as shown in FIGS. 2A and 2B, a first arm 552A and a second arm 552B which is capable of sliding freely on the first arm 552A, so that the second arm 552B can be extended and contracted by being moved forward and backward with respect to the first arm 552A. Further, a maneuvering handle 552C is installed at the arm 552 so as to make it possible to maneuver the arm 552 by gripping the maneuvering handle 552C. The length of the arm 552 is configured to be preferably adjusted by fixing the second arm 552B to the first arm 552A with an adjustment member 552D, which prevents the second arm 552B from freely sliding along the first arm 552A.

The arm 552, as shown in FIGS. 2A and 2B, is configured such that a base end portion of the first arm 552A is pin-hinged to a joint 555 attached to a top end portion of the supporting unit 553 and the arm 552 can be folded onto the supporting unit 553 when the 552 is fully contracted. That is, a base end portion of the arm 552 is pin-hinged to a joint 555 with a first pin 552E such that a bracket 556 with a pin-attached thereto is disposed approximately at a vertical middle portion of the supporting unit 553. Further, two end-portions of a link 557 are further connected at the first pin 552E and the pin of the bracket 556, respectively. As a result, the arm 552 can be raised and maintained in a horizontal state with the link 557. At an end portion of the link 557 at the side of the arm 552, a second pin 557A is attached; and at a side surface of the supporting unit 553, an engaging member 558 is attached as well, wherein the engaging member 558 is engaged onto the second pin 557A so as to maintain the arm 552 horizontally.

The supporting unit 553 and the air cylinder 554A are, as shown in FIGS. 2A and 2B, both connected to a rotational body 560, which is attached to the end portion of the base 559 in a freely rotating manner, and configured to revolve at the end portion of the base 559 through the rotational body 560. Also, a guide rail 561 is attached at the rear surface of the rotational body 553 as a whole along a vertical direction of the rotational body 553, and a block 561A securely attached to the guide rail 561 is fixed to the rotational body 560. Further, as shown in FIG. 2B, as for the air cylinder 554A, two end-portions of the cylinder main body are supported perpendicularly at the rotational body 560 and a support 560A which is extended downwardly from the rotational body 560. In addition, provided at the top portion of the supporting unit 553 is a lead member 561B which leads an elevating and a rotating motion of the supporting unit 553, and some portion of the lead member 561B is inserted into a groove of a guide member 561C having a groove of an inversed U shape. Also, in FIG. 2B the reference numeral 554a represents a cylinder rod covered with a cylinder cover.

Figure 3:
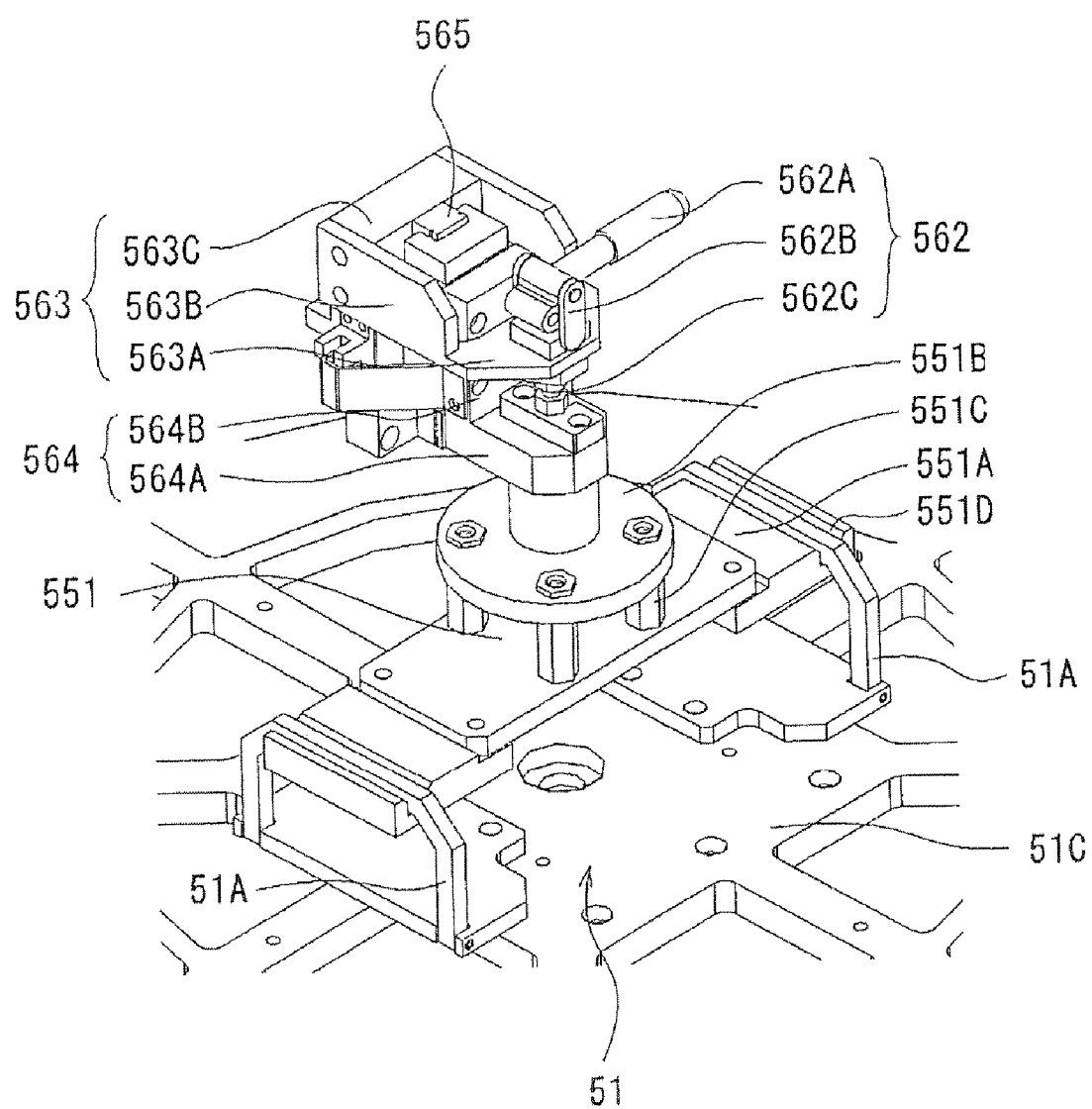
FIG. 3 is a perspective view showing an enlarged portion of the probe card transfer assist apparatus shown in FIGS. 2A and 2B.

As shown in FIG. 3, the holder at a leading end of the arm 552 includes a rectangular shaped first plate member 551A, a radial shaped second plate member 551B disposed at an upper portion of the middle of the first plate member 551A, and a coupling member 551C which connects the first and the second plate member 551A and 551B with each other. It is also configured to support the probe card 51 with a pair of grooves 551D formed at the two end portions of the first plate member 551A. The grooves 551D are formed along the entire width of the first plate member 551A while allowing a distance between a pair of grips 51A of the probe card 51 and a length of a straight line portion of the grips 51A, the line portion being maintained at the first plate member 551A. Further, a plurality of the coupling members 551C is attached, each being separated from a neighboring one by an equal distance along an entire circumference at an outer peripheral portion of the radial shaped second plate member 551B. In addition, in the first embodiment, the first plate member 551A is configured with a middle substrate and substrates at its right and left sides, e.g. forming three substrates in total.

Figure 4A:
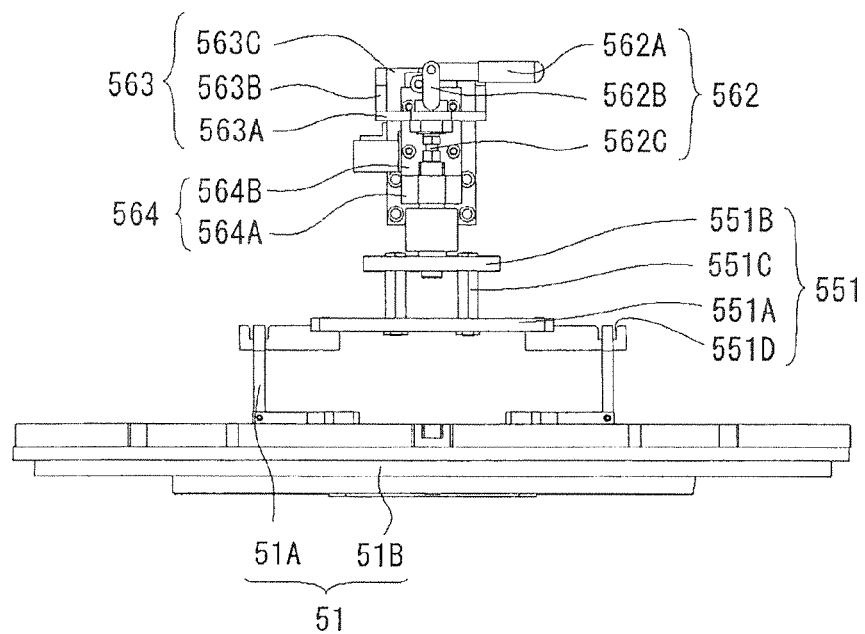
FIG. 4A is a front view showing a supporting state of the probe card at a supporting portion of the probe card transfer assist apparatus shown in FIG. 1.
Figure 4B:
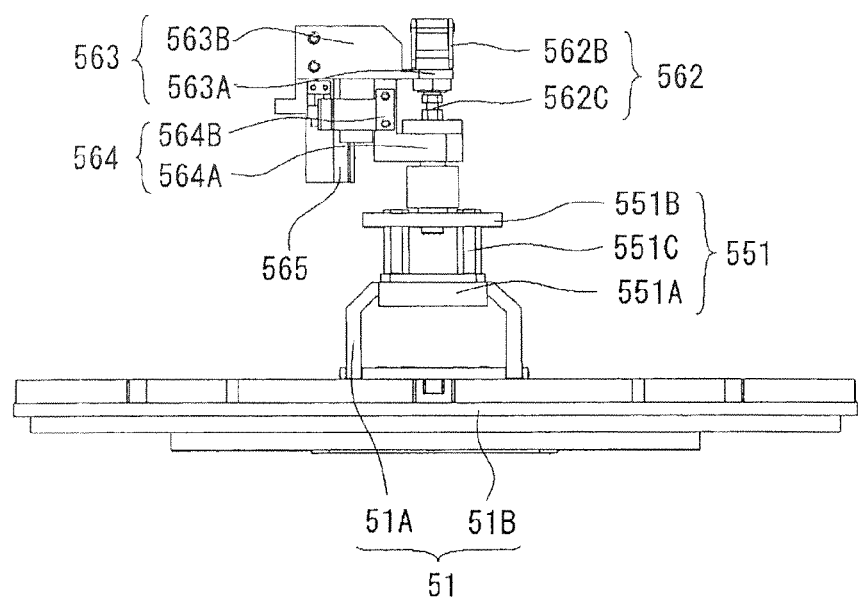
FIG. 4B is a side view thereof.

Further, the holder 551 is, as shown in FIGS. 3, 4A and 4B, configured to move up and down at a leading end of the arm 552 when maintaining the probe card 51 through the toggle device 562. That is, the toggle device 562 is installed at an installation table 563, which is secured at a leading end of the second arm 552B, while having a maneuvering lever 562A and an elevation rod 562C pin-hinged to the maneuvering lever 562A through a link mechanism 562B so as to make it possible to move up and down.

The installation table 563 includes an installation portion 563A substantially in a shape of a rectangle, a pair of side surfaces 563B formed at two side-ends of the installation portion 563A, and a rear surface 563C which connects the space between the side surfaces 563B and 563B. Further, a gap is formed between a rear end portion of the installation portion 563A and the rear surface 563C. The elevation rod 562C of the toggle device 562 penetrates through a hole formed at the installation portion 563A and the holder 551 is connected through an elevation body 564 at its lower end.

The elevation body 564 includes a horizontal portion 564A and a vertical portion 564B embedded from a rear end portion of the horizontal portion 564A to a space of the installation table 563 and the holder 551 is connected at a lower surface of the horizontal portion 564A. The elevation body 564 is configured to be moved up and down with a linear guide unit 565 presented at a space between the vertical portion 564B and the installation table 563.

The probe card 51 handled by the probe card transfer assist apparatus 55 is configured, for example, in a manner shown in FIGS. 2A and 2B. That is, as shown in FIGS. 2A and 2B, the probe card 51 includes, for example, a card main body 51B substantially in a circular shape and having a circuit board; a reinforcing member 51C disposed at a top surface of the card main body 51B and a contactor, having a plurality of pins, attached at a middle portion of the bottom surface of the card main body 51B. Further, the reinforcing member 51C includes a rectangular section 51D formed at a middle portion of the card main body 51B; a radial section 51E extending radially from the rectangular section 51D to an outside border of the card main body 51B; and a ring-shaped portion 51F formed approximately at a middle portion of the radial section 51E. A pair of grips 51A is attached through attaching members 51G at right and left of a top surface of the rectangular section 51D, respectively. The grips 51A are configured to be folded to respective sides when not in use.

Figure 5:
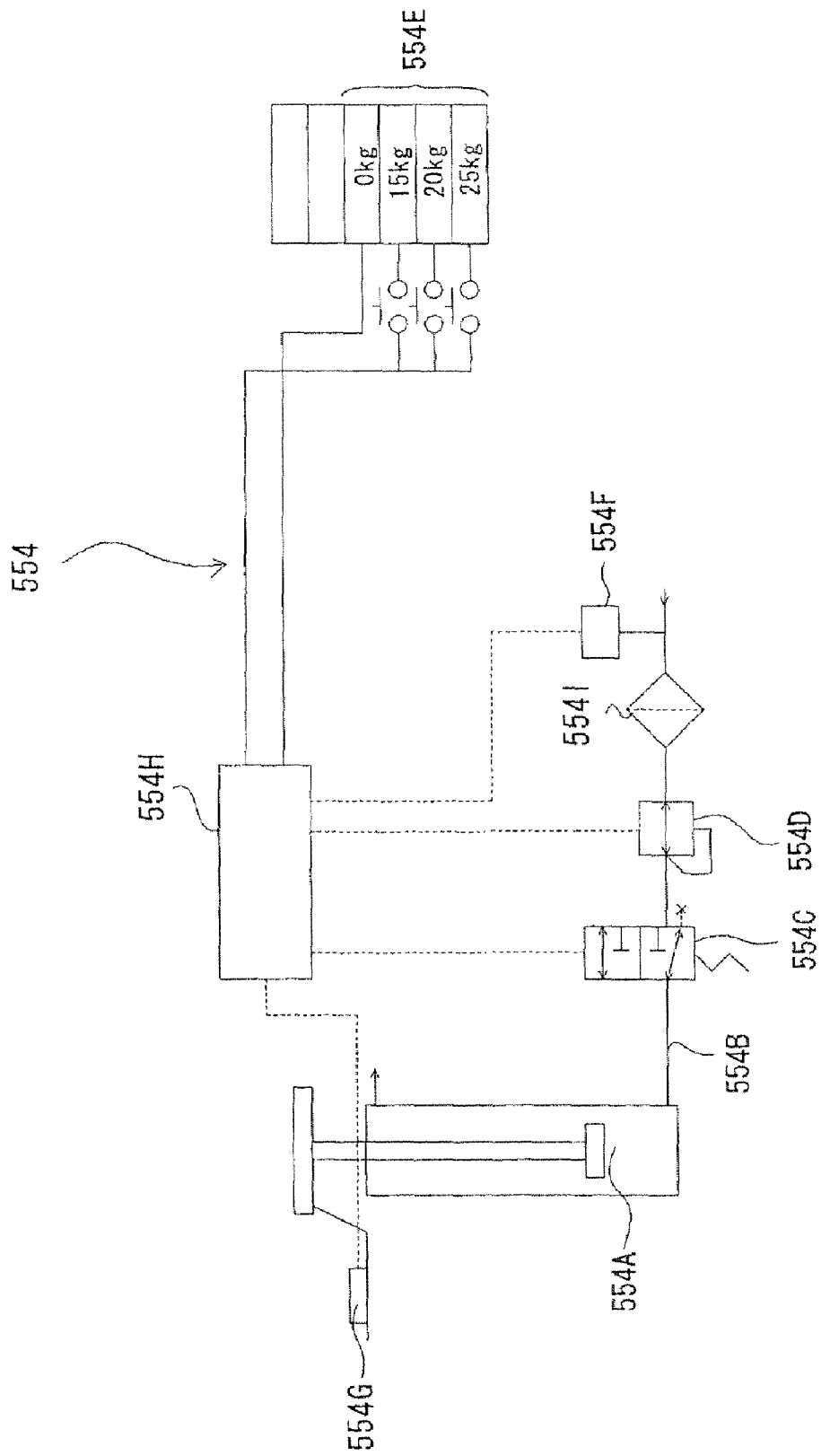
FIG. 5 is a block diagram illustrating a configuration of an elevation driving unit in the probe card transfer assist apparatus shown in FIGS. 2A and 2B.

As shown in FIG. 5, the elevation driving unit 554 which moves the arm 552 up and down, for example, includes the air cylinder 554A; an electromagnetic valve (e.g., a three-port valve) 554C for opening and closing a line 554B, which provides a driving fluid (compressed air) to the air cylinder 554A; an electro-pneumatic regulator 554D which controls a pressure of the compressed air in accordance with a weight of the probe card 51; an input terminal 554E for inputting a pressure value of the compressed air, the value selected in advance appropriately in line with a weight of the probe card 51; and a pressure sensor 554F for detecting pressure of the compressed air. Further, based on an input value from the input terminal 554E, the air cylinder 554A is controlled by having the electromagnetic valve 554C and the electro-pneumatic regulator 554D cooperating together.

Also, the elevation driving unit 554 includes a maneuvering switch 554G which functions when the maneuvering handle 552C is operated while being gripped. Further, as discussed below, the maneuvering switch 554G is configured to control an opening and a closing of the electromagnetic valve 554C and the electro-pneumatic regulator 554D through a maneuvering thereof. That is, the maneuvering switch 554G is electrically connected to the input terminal 554E through a controller 554H and only when the maneuvering switch 554G is turned to an "on" state, the electro-pneumatic regulator 554D is operated based on the pressure value inputted from the input terminal 554E through the controller 554H. At the same time, the electromagnetic valve 554C is turned to an "on" state.

Also, when the maneuvering switch 554G is on, the electromagnetic valve 554C is opened by the controller 554H and compressed air is supplied to the air cylinder 554A under a control of the electro-pneumatic regulator 554D. However, when the maneuvering switch 554G is off, the electromagnetic valve 554C is closed by the controller 554H and the compressed air is sealed within the air cylinder 554A, which in turn stops the air cylinder 554A, thereby stopping the arm 552 during the course of descending. For example, there could be a case where a weight of the probe card 51 is larger than an inputted weight from the input terminal 554E. Given this circumstance, during a rotation of the arm 552 while gripping the maneuvering handle 552C, an insufficient upthrust force is supplied, which makes the arm 552 start to descend due to the gravity.

At this time, if an operator, who is unaware of the error in the input value, decides to release the maneuvering handle 552C intentionally or unintentionally, the maneuvering switch 554G is turned to an "off" state, thereby closing the electromagnetic valve 554C, and the compressed air supplied to the air cylinder 554A up to that time gets sealed within the air cylinder 554A. Consequently, because the arm 552 gets lowered due to the self-gravity weight of the probe card 51, which in turn further compresses the compressed air sealed thereof to thereby increase the pressure therein, the arm 552 gets eventually stopped during the course of descending, thereby preventing further descending of the probe card 51. Also, in case a weight of the probe card 51 is set too small at the input terminal 554E, a sudden elevation of the air cylinder 554A can be prevented in a manner similar to the above-mentioned case, by releasing the maneuvering handle 552C from hands of an operator. In addition, the reference symbol 554I in FIG. 5 is a mist separator.

Operation procedures will be described hereinafter. When placing or replacing the probe cards 51 at the inspection apparatuses 52 of the inspection equipment 50, an operator takes out a specific number of the probe cards 51 from the maintenance shelf and loads the probe cards 51 into the transfer vehicle 54 along with the trays. Further, as shown in FIG. 1, the transfer vehicle 54 is transferred to a designated inspection apparatus 52.

While maintaining the probe cards 51 received along with the trays on the shelves of the transfer vehicle 54, the operator removes one of the probe cards 51 from the transfer vehicle 54 and then moves it to a top side of the transfer vehicle 54. Only the moved probe card 51 is then transferred to the inspection apparatus 52 by employing the probe card transfer assist apparatus 55. Here, in case of using the probe card transfer assist apparatus 55, a weight of the probe card 51 is determined and inputted in advance by using the input terminal 554E of the elevation driving unit 554. Next, after raising the arm 552 with a link 557, the engaging member 558 is hooked onto a second pin 557A, thereby maintaining the arm 552 at a horizontal state. At this state, the arm 552 is rotated directly above the probe card 51 by maneuvering the maneuvering handle 552C, thereby setting the holder 551 to be in alignment with the center of the probe card 51.

Further, after lowering the holder 551 down to an area near the center of the probe card 51 by using the maneuvering handle 552C, a first plate member 551A is located to a middle position of the grips 51A and 51A. If the grips 51A and 51A of the probe card 55 are raised, the grips 51A and 51A are configured to move to a position directly above the grooves 551D of left and right of the first plate member 551A. Thereafter, if the holder 551 is lifted through the elevation body 564 by the elevation rod 562C after reversing the maneuvering lever 562A of the toggle device 562 to a position shown in FIG. 3, the grips 51A and 51A are inserted into the right and the left groove 551D and 551D of the first plate member 551A as shown in FIGS. 3 and 4. At this time, if the operator turns the maneuvering switch 554G on while gripping the maneuvering handle 552C, the electromagnetic valve 554C goes to an "open" state since the pressure sensor 554F is turned on by detecting an ordinary pressure of a compressed air. Therefore, compressed air with a predetermined pressure which is determined based on the inputted weight of the probe card 51 is supplied within the air cylinder 554A under the control of the electro-pneumatic regulator 554D. Resulting from this, an assisting force is provided in a direction of which the probe card 51 is lifted from the shelf of the transfer vehicle 54 by the arm 552. Now, the operator lifts the probe card 51 by maneuvering the maneuvering handle 552C from the shelf of the transfer vehicle 54. Further, by rotating the arm 552 toward the inspection apparatus 52, the probe card 51 is moved directly over to the card transfer unit 52B of the inspection apparatus 52.

After putting down the probe card 51 on the card transfer unit 52B by lowering the maneuvering handle 552C from directly above the card transfer unit 52B and then by reversing the maneuvering lever 562A of the toggle device 562 from a position shown in FIG. 3 thereafter, the holder 551 is descended. Further, the first plate member 551A is separated from the grips 51A and 51A of the probe card 51. Continuously, after separating the grips 51A and 51A from the first plate member 551A by laying down them to a side of the card main body 51B, the probe card 51 is freed from the holder 551, thereby completing the transfer operation of the probe card 51.

However, there could be a case where a weight of a probe card 51 is wrongly inputted in the input terminal 554E, for example, less than an actual weight. At the same time, the maneuvering handle 552C could be gripped, thereby turning the maneuvering switch 554G on, which in turn operates the air cylinder 554A driven by the electro-pneumatic regulator 554D. In this case, because the arm 552 is descended due to the heavier weight of the probe card 51 during rotation of the arm 552, the maneuvering handle 552C could be released from the hands of the operator as a consequence. Here, because the maneuvering switch 554G goes automatically to an "off" state, the electromagnetic valve 554C is shut, thereby sealing the compressed air supplied up to that time within the air cylinder 554A. Accordingly, the descending arm 552 is stopped during the course of descending before falling completely as a result of the pressure increase in the compressed air sealed within the air cylinder 554A. This prevents collisions of the probe card 51 against the transfer vehicle 54 or the like and also prevents the probe card 51 from being damaged.

Further, when transferring the probe cards 51 from the inspection apparatuses 52 to the transfer vehicle 54, the probe card transfer assist apparatuses 55 can be employed in the order described above. Consequently, the transfer of the probe cards 51 can be carried out with ease.

In accordance with the first embodiment of the present invention, the inspection equipment 50 includes one or more inspection apparatuses 52 (only one is illustrated in FIG. 1), each employing the probe card 51 for performing an electrical characteristics inspection of a wafer; the transfer vehicle 54 for transferring the probe card 51 along the passageway 53 where the inspection apparatuses 52 are placed; and the probe card transfer assist apparatus 55 which is adapted to assist a transferring of the probe card 51 between the transfer vehicle 54 and the card transfer unit 52B disposed at the apparatus main body 52A of the illustrated inspection apparatus 52, the apparatus main body 52A of each inspection apparatus 52 being provided with one card transfer unit 52B.

Further, the probe card transfer assist apparatus 55 includes the holder 551 which holds the probe card 51 by holding onto its grips 51A; the extensible and contractible arm 552 disposed at an end portion of the holder 551; the supporting unit 553 capable of freely rotating while supporting the arm 552; and the elevation driving unit 554 which moves the probe card 51 up and down with the above supporting unit 553 in accordance with the weight of the probe card 51. Accordingly, the probe card 51 is held by the holder 551, and the arm 552 is lifted from the transfer vehicle 54 or from the card transfer unit 52B of the inspection apparatus 52 by the elevation driving unit 554, and by rotating the arm 552 by maneuvering the maneuvering handle 552C, the operator could transfer the probe card 51 between the transfer vehicle 54 and the card transfer unit 52B of the inspection apparatus 52 without having to do a hard labor, thereby reducing a burden of operator significantly.

Also, because the arm 552, while being contracted, moves the probe card 51 held by the holder 551 by rotating about the rotational body 560, a range of the arm's motion which sets a base end of the arm 552 as a center could be minimally restricted. Accordingly, a plurality of the inspection apparatuses 52 can be aggregated to save space for the inspection equipment 50, and to thereby make gaps between adjacent inspection apparatuses 52 small. Consequently, although it may be impossible to dispose the transfer vehicle 54 between the small gaps, spaces for the arms 552 to rotate from the transfer vehicle 54 disposed along the passageway 53 to a side of the inspection apparatus 52 can be obtained. At the same time, spaces sufficient enough for the operator to enter and exit can also be provided.

Also, in accordance with the first embodiment, since the holder 551 includes the grooves 551D and 551D which correspond to the straight line portion supported at the gap between the grips 51A and 51A and the first plate member 551A of the grips 51A and 51A, it firmly supports the probe card 51, which in turn, allows the probe card 51 to be transferred at a stabilized state. Further, the holder 551 holds the grips 51A and 51A by placing them into the grooves 551D and 551D. Therefore, when maintaining the supported probe card 51 at a predetermined place from above a ground, the arm may not have enough stiffness and may be subject to bending. However, by lowering the holder 551 with the elevation driving unit 554 or the toggle device 562 enough to a point where the arm is free from the bending, the grips 51A and 51A get raised from the grooves 551D and 551D. Accordingly, if the grips 51A and 51A are removed thereafter, the operation of installing the probe card 51 can be carried out securely. Further, since the holder 551 is configured to be moved up and down at a position approximately above the probe card with the toggle device 562, the height of the holder 551 can be adjusted in two steps, through the elevation driving unit 554 and the toggle device 562, thereby preventing, for example, a case in which the holder 551 is damaged by being collided with the card main body 51B.

Further, the elevation driving unit 554 includes the air cylinder 554A which moves the arm 552 up and down; the electromagnetic valve 554C for opening and closing a line 554B which provides compressed air to the air cylinder 554A; the electro-pneumatic regulator 554D which controls a pressure of the compressed air in accordance with a weight of a probe card 51; the input terminal 554E for inputting a pressure value of the compressed air to the electro-pneumatic regulator 554D in advance; and the pressure sensor 554F for detecting pressure of the compressed air. Therefore, a driving force of the air cylinder 554A can be controlled in accordance with a weight of the probe card 51. It is also preferred that a weight of the probe card 51 is measured with a weight sensor and the driving force of the air cylinder 554A is controlled based on the measured weight Also, the elevation driving unit 554 includes the maneuvering switch 554G for maneuvering the arm 552. Further, the maneuvering switch 554G and the pressure sensor 554F communicate with each other to open and close the electromagnetic valve 554C. Therefore, if the maneuvering handle 552C is let go from the hands of the operator, the maneuvering switch 554G is automatically turned off, which in turn, closes the electromagnetic valve 554C, thereby restricting a gravitational descending of the arm 552 due to the weight of the probe card 51. This prevents the probe card 51 from being damaged.

Second Embodiment

Because the probe card transfer assist apparatus of the present embodiment is substantially identical to the first preferred embodiment except for a holding portion, discussion will be made mainly on the features of the present embodiment while designating like parts to those of the first embodiment with like reference symbols.

Figure 6A:
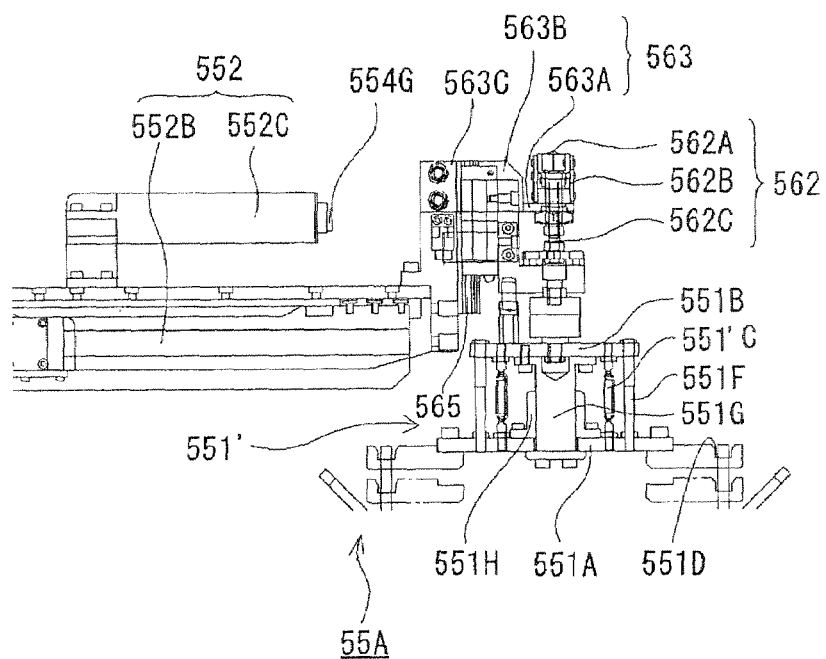
FIG. 6A is a top view showing a portion of a different embodiment of the probe card transfer assist apparatus of the present invention.
Figure 6B:
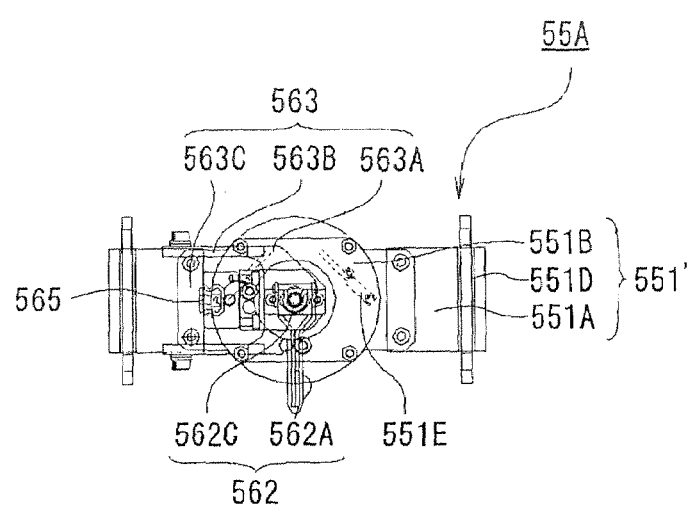
FIG. 6B is a side view showing its holder.

A probe card transfer assist apparatus 55A of the present embodiment is configured with, for example, a holder 551' and an arm 552 as shown in FIGS. 6A and 6B, and a supporting unit 553 and an elevation driving unit 554 (see FIG. 1) as shown in FIGS. 2A and 2B.

The holder 551' in the present embodiment includes, as shown in FIGS. 6A and 6B, the first plate member 551A having the grooves 551D for placing the grips 51A of the probe card 51 thereinto; the second plate member 551B disposed at an upper portion of the first plate member 551A and holding the first plate member 551A while allowing up and down movements thereof; and the card detecting sensors 551E for detecting change in the distance between the first and the second plate member 551A and 551B, respectively.

The first plate member 551A is supported by the second plate member 551B while being allowed to move up and down. That is, as shown in FIG. 6A, a plurality of resilient members (for example, spring members) 551C is attached along an outer peripheral portion of the circular shaped second plate member 551B while being separated from a neighbor by an equal distance in the circumferential direction and further the first plate member 551A is connected at a lower end of these spring members 551C. Further, at outer sides of the spring members 551C, a plurality of extensible and contractible apparatuses 551F is attached along an outer peripheral portion of the second plate member 551B while being separated from a neighbor by an equal distance in the circumferential direction. As the extensible and contractible apparatuses 551F are configured with, for example, a rod installed at the first plate member 551A vertically and a dry bushing which is extensible vertically at the second plate member 551B, it is in synchronization with the extending and contracting of the spring members 551C, thereby allowing the rod to move upwardly and downwardly within the dry bushing.

As shown in FIG. 6A, a columnar shaped elevation guide 551G is, for example, extended downwardly in a vertical manner from a middle of the second plate member 551B and the elevation guide 551G is configured to pass through a hole formed at a middle of the first plate member 551A. Since a flange is formed at a lower end of the elevation guide 551G, the first plate member 551A descending due to the effect of the weight of the probe card 51 is configured to be engaged with this flange. Further, a collar 551H is provided at an upper side of the first plate member 551A to allow the first plate member 551A to elevate smoothly along the elevation guide 551G.

Also, as shown in FIGS. 6A and 6B, the card detecting sensors 551E are disposed, for example, at an upper side of the first plate member 551A while maintaining an angular distance of 180 degrees between them in a circumferential direction of the first plate member 551A and the probe card 51 is detected by the card detecting sensors 551E. These card detecting sensors (e.g., capacitance sensors) 551E are configured to detect whether or not the probe card 51 is supported to be held based on the change in the distance between the first and the second plate member 551A and 551B while the first plate member 551A is descending due to the effect of the weight of the probe card 51 along the elevation guide 551G while being resisted by the spring force of the spring members 551C. Further, the card detecting sensors 551E may be provided at a side of the second plate member 551B. As for the card detecting sensors 551E, optical sensors can also be used instead of the capacitance sensors.

Figure 7:
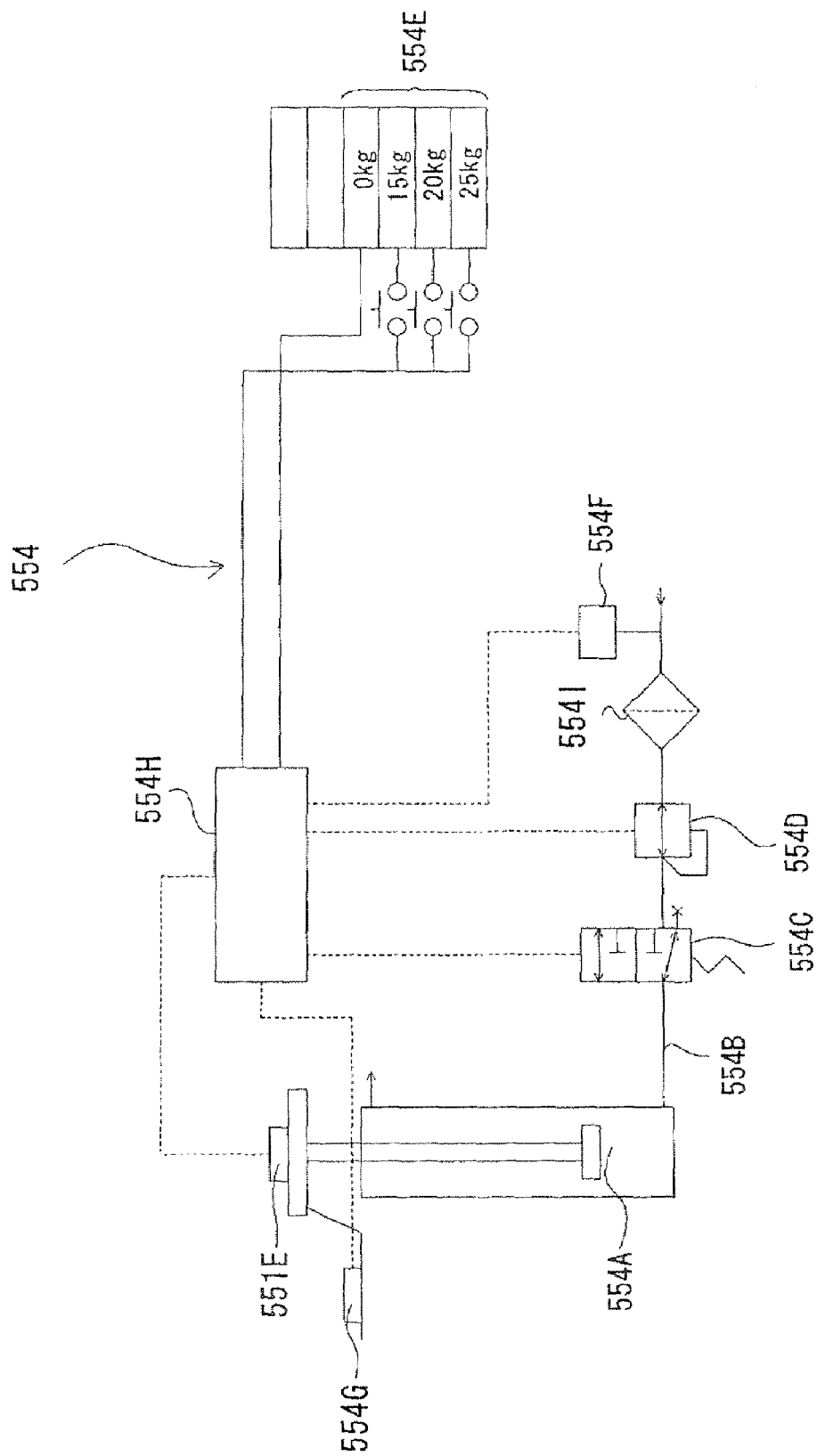
FIG. 7 is a block diagram illustrating a configuration of an elevation driving unit in the probe card transfer assist apparatus shown in FIGS. 6A and 6B.

Also, as shown in FIG. 7, identical to the above embodiment, the elevation driving unit 554 employed in the present embodiment includes essentially, for example, an the air cylinder 554A, the line 554B, the electromagnetic valve 554C, the electro-pneumatic regulator 554D, the input terminal 554E, the pressure sensor 554F, the maneuvering switch 554G, the controller 554H and the mist separator 554I. Also, only when the card detecting sensors 551E and the maneuvering switch 554G are turned on, the electro-pneumatic regulator 554D is initiated based on the input value from the input terminal 554E by the controller 554H. At the same time, the electromagnetic valve 554C is turned on.

Next, an operation of the probe card transfer assist apparatus 55A will be discussed. The present embodiment will be discussed mainly on the points that are different from the first embodiment. As identical to the first embodiment, the holder 551' is moved to directly above the middle of the probe card 51 through the maneuvering handle 552C. Continuously, after the first plate member 551A of the holder 551' is lowered to a position close to the card main body 51B by manipulating a toggle device 562, the grips 51A and 51A are raised from the card main body 51B.

Thereafter, when the holder 551' is elevated after maneuvering a maneuvering handle 562A of the toggle device 562, the grips 51A and 51A are inserted into the grooves 551D and 551D of the first plate member 551A, and the first plate member 551A is descended along the elevation guide 551G while resisting against the spring members 551C. Further, the probe card 51 is elevated from a point where the first plate member 551A is stopped at the flange of the elevation guide 551G. When the first plate member 551A starts to descend from the second plate member 551B by having the spring members 551C extended, the card detecting sensors 551E detect the probe card 51 based on the change in the distance between the first and the second plate member 551A and 551B, and its detection signal is transmitted to the controller 554H.

Thereafter, if the operator grips the maneuvering handle 552C and turns the maneuvering switch 554G, the controller 554H of the elevation driving unit 554 opens the electromagnetic valve 554C based on a signal from both the maneuvering switch 554G and the card detecting sensors 551E and then, a compressed air of a predetermined pressure based on the weight of the probe card 51 is supplied to the inside of the air cylinder 554A under a control of the electro-pneumatic regulator 554D. With a supplement force provided from this, the arm 552 can be lifted with the probe card 51 from a shelf of the transfer vehicle 52. At this state, the operator rotates the arm 552 between the transfer vehicle 54 and the inspection apparatus 52 by maneuvering the maneuvering handle 552C, thereby completing the transfer operation of the probe card 51. Besides the above matters, the present embodiment is identical to the first embodiment.

In accordance with the present embodiment as explained above, the holder 551' includes the first plate member 551A having the grooves 551D, the second plate member 551B disposed at the upper portion of the first plate member 551A and supporting the first plate member 551A in a manner to make it possible to move up and down, and the card detecting sensors 551E for detecting the probe card 51 based on the change in the distance between the first and the second plate member 551A and 551B. Therefore, the holder 551' can definitely detect whether or not the probe card 51 is supported to be held with the card detecting sensors 551E. Also, the elevation driving unit 554 is configured to provide the supplement force to the arm 552 based on the detection signal from both the card detecting sensors 551E and the maneuvering switch 554G, and only when the probe card 51 is detected from the holder 551' the probe card 51 can be lifted. Besides the above matters, the present embodiment is expected to have an identical operation and effect of the first embodiment.

Third Embodiment

Figure 8A:
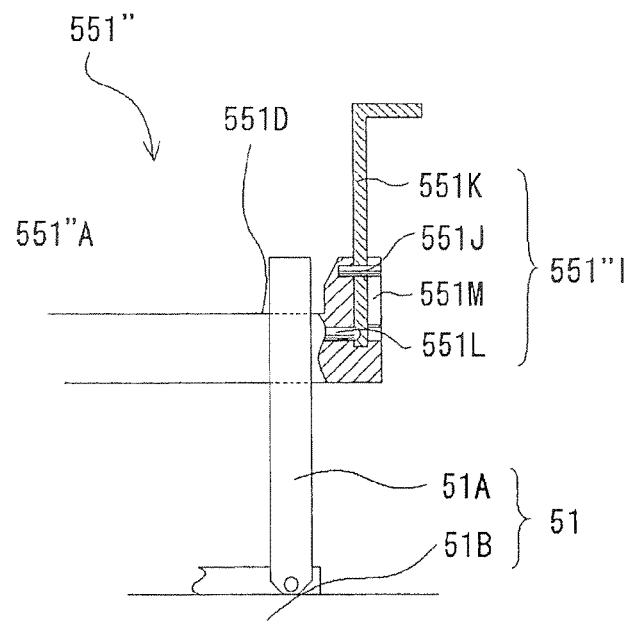
FIG. 8A is an enlarged partial cutaway front view showing major parts of a holder in another embodiment of the probe card transfer assist apparatus of the present invention.
Figure 8B:
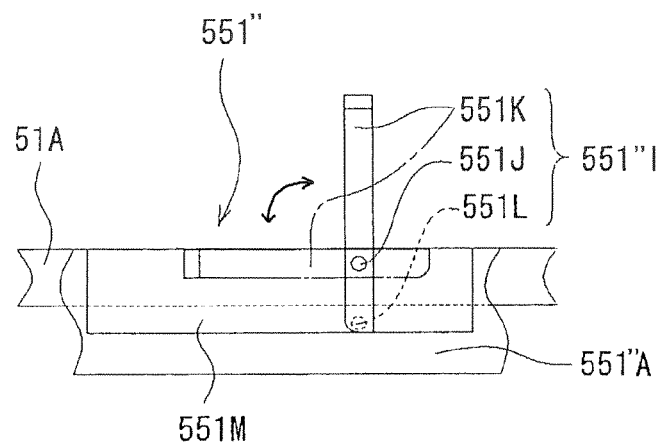
FIG. 8B is a side view thereof.

The probe card transfer assist apparatus of the present embodiment is substantially identical to the first embodiment except for the fact that it differs in the construction of the holder 551", e.g., as shown in FIGS. 8A and 8B. Therefore, discussion will be made mainly on the features of the present embodiment while designating like parts to those of the first embodiment with like reference symbols.

The holder 551" of the present embodiment is characterized in that it includes release prevention members 551I for preventing from the grooves 551D a release of a pair of the grips 51A, the release prevention members 551" placed at two opposite end portions of a first plate member 551"A outside the grooves 551D as shown in FIGS. 8A and 8B. That is, as shown in FIG. 8A, each release preventing member 551"I includes a lever 551K attached at one of the end portions of the first plate member 551"A through a pin 551J; and a movable pin 551L that moves back and forth with respect to a hemispheric hole formed at a lower end portion of a backside surface of the lever 551K. As shown in FIG. 8B, by raising or folding the lever 551K in a 90 degree range that is both a vertical and a horizontal direction about the pin 551J within a groove 551M, the lever 551K is maintained at a horizontal state after the movable pin 551L is inserted into the hemispheric hole of the backside surface, thereby preventing the grip 51A from being released from the grooves 551D of the first plate member 551"A. When removing the grips 51A from the first plate member 551"A, the lever 551K is folded to a horizontal state and inserted into the thin groove 551M formed at an end surface of the first plate member 551"A.

Therefore, in the present embodiment, by placing the grips 51A of the probe card 51 onto the grooves 551D of the first plate member 551"A and maintaining a horizontal state thereof with the movable pin 551L by raising the lever 551K, the probe card 51 can be more securely transferred without releasing the grips 51A from the grooves 551D of the first plate member 551"A regardless of the holder 551" being descended to some extent.

Fourth Embodiment

Figure 9:
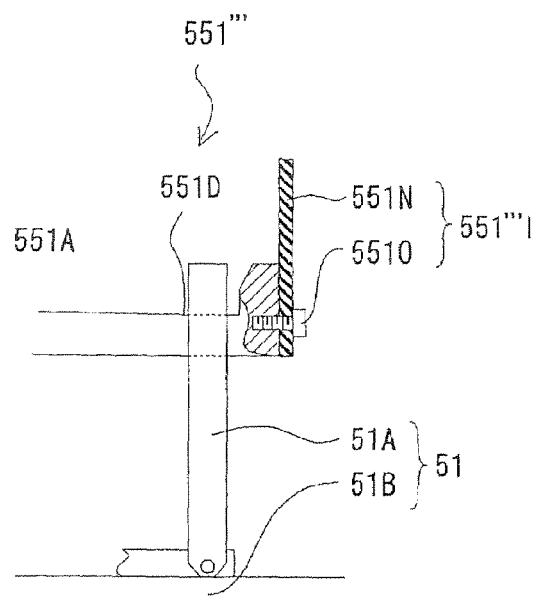
FIG. 9 is an enlarged partial cross sectional front view showing a portion of a holder in a still another embodiment of the probe card transfer assist apparatus of the present invention.

The probe card transfer assist apparatus of the present embodiment is configured in a manner identical to the third embodiment except for release prevention members 551'"I, for example, as shown in FIG. 9. Therefore, discussion on the holder 551'" will be made mainly on the features of the present embodiment while designating like parts to those of the first embodiment with like reference symbols.

The release prevention members 551'"I of the present embodiment is configured with a flexible member 551N made of a rubber attached to two end-surfaces of the first plate member 551A as shown in FIG. 9. While being in a rectangular shape and formed by covering a whole end surface of the first plate member 551A and in a size protruding from an upper surface of the first plate member 551A, the flexible member 551N is fixed to an end surface of the first plate member 551A by a plurality of bolts 551O. Accordingly, when placing the grips 51A of the probe card 51 onto the grooves 551D of the first plate member 551A over the flexible member 551N, the grips 51A are kept by the flexible member 551N within the grooves 551D without being released from the first plate member 551A. Therefore, the present embodiment is expected to have an identical operation and effect of the third embodiment.

Fifth Embodiment

Figure 10:
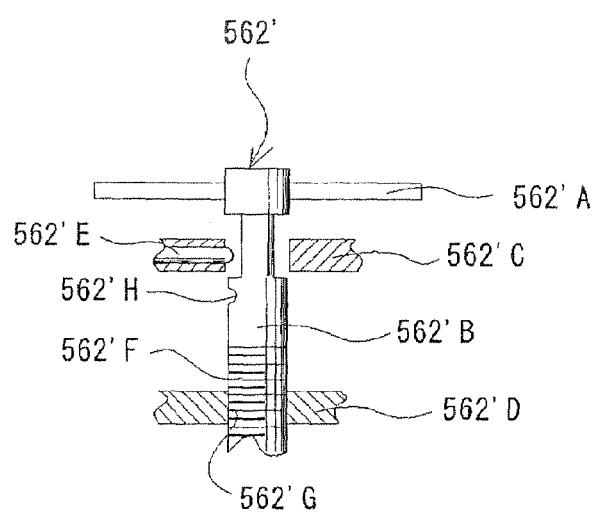
FIG. 10 is a cross sectional view showing an elevation unit of the holder in a still another embodiment of the probe card transfer assist apparatus of the present invention.

In the above embodiments, a toggle device 562 has been discussed as an example of means for moving the holder up and down. However, an elevation mechanism shown in FIG. 10 can also be employed in lieu of the toggle device 562. As in the present embodiment, as shown in FIG. 10, this elevation mechanism 562' includes a maneuvering handle 562'A, an elevation rod 562'B connected to the maneuvering handle 562'A, and an installation portion 563A having at its top and bottom a first substrate 562'C and a second substrate 562'D where the elevation rod 562'B passes through. Further, a holder (not shown) is connected at a lower end of the elevation rod 562'B. A movable pin 562'E, which moves back and forth at a circumferential surface of a through hole, is provided within the first substrate 562'C, and a female screw portion 562'G, which is screwed onto a male screw portion 562'F of the elevation rod 562'B, is formed at a circumferential surface of the second substrate 5562'D. Accordingly, when rotating the maneuvering handle 562'A, the elevation rod 562'B is elevated with respect to the second substrate 562'D, thereby allowing an elevation of the holder 551.

In case of placing the grips (not shown) of the probe card onto the first plate member (not shown) of the holder, after locating the holder 551 to a lower end portion through the elevation rod 562'B by maneuvering the maneuvering handle 562'A of the elevation mechanism 562', the grips of the probe card are placed onto the first plate member. Further, when the holder is elevated by maneuvering the maneuvering handle 562'A, the hemispheric hole of the elevation rod 562'B and a leading end of the movable pin 562'E are insertion-fitted, thereby causing the elevation rod 562'B to stop without any further elevation. At this state, the probe card is transferred to a predetermined location by maneuvering the arm (not shown).

Sixth Embodiment

The probe card transfer assist apparatus of the present embodiment is substantially identical to the first embodiment except for an attaching device 662 and a holder 651. Therefore, with reference to FIGS. 11A to 14B, discussion will be made mainly on the unique features of the present embodiment while designating like parts to those of the first embodiment with like reference symbols.

Figure 11A:
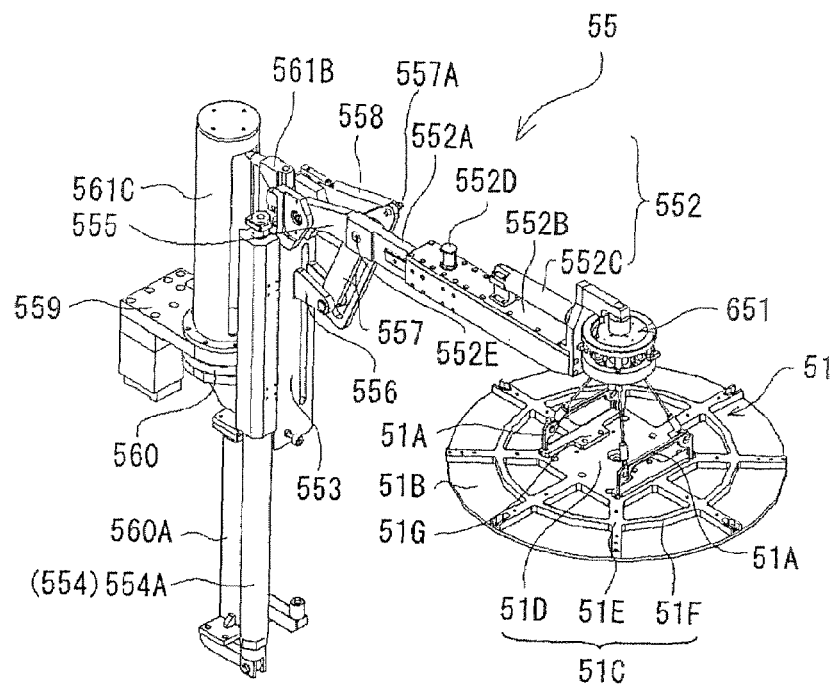
FIG. 11A is a perspective view illustrating major parts of a probe card transfer assist apparatus in accordance with still another embodiment of the present invention, applied to the inspecting equipment, and 11B is a side view thereof.
Figure 11B:
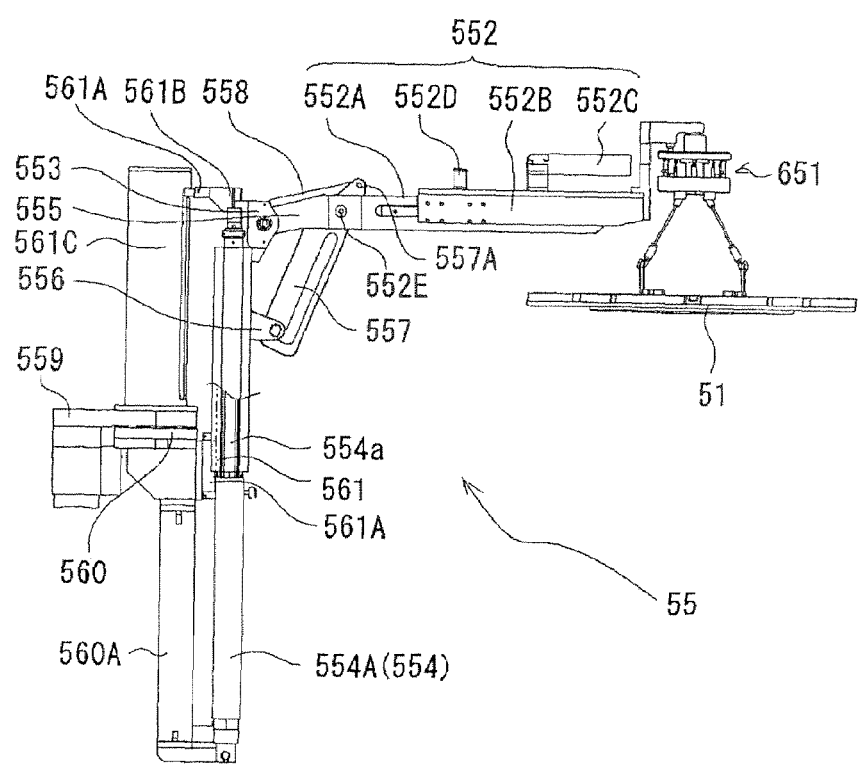

As shown in FIGS. 11A and 11B, the probe card transfer assist apparatus 55 of the present embodiment is disposed at one side of the inspection apparatus 52 and includes, as shown in FIGS. 11A and 11B, the holder 651 for holding the probe card 51; an extensible and contractible arm 552, the holder 651 being disposed at an end portion of the arm 552; a rotatable supporting unit 553 capable of supporting the arm 552; and an air cylinder 554A included in an elevation driving unit 554 which moves the probe card 51 up and down with the supporting unit 553 in accordance with a specified weight of each probe card 51.

The holder 651 at a leading end of the arm 552 includes, as shown in FIGS. 12 to 14B, a circular shaped first member 651A; a circular shaped second member 651B disposed above a center of the first member 651A and formed with an approximately same diameter of the first member 651A; a plurality (there are four in the present embodiment) of resilient members (e.g., spring members) 651C for connecting the first member 651A to the second member 651B; a plurality (there are four in the present embodiment) of wires 651D attached at a lower surface of the first member 651A; and card detecting sensors (e.g., capacitance sensors) 651E for detecting respective change in the distance between the first and the second member 651A and 651B. As shown in FIGS. 12 to 14B, the holder 651 is fixed to a leading end of the arm 552 through an attaching device 662 having an L-shaped side surface. The first member 651A is formed in a cylindrical shape having a bottom portion with a flat sidewall; the second member 651B is formed in a plate shape; and the first and the second member 651A and 651B are placed on a same axis. Since hooks 651F are attached at a lower end of the wires 651D, the probe card 51 is lifted by being suspended after placing the hooks 651F to hole provided at an edge of the grips 51A.

Figure 12:
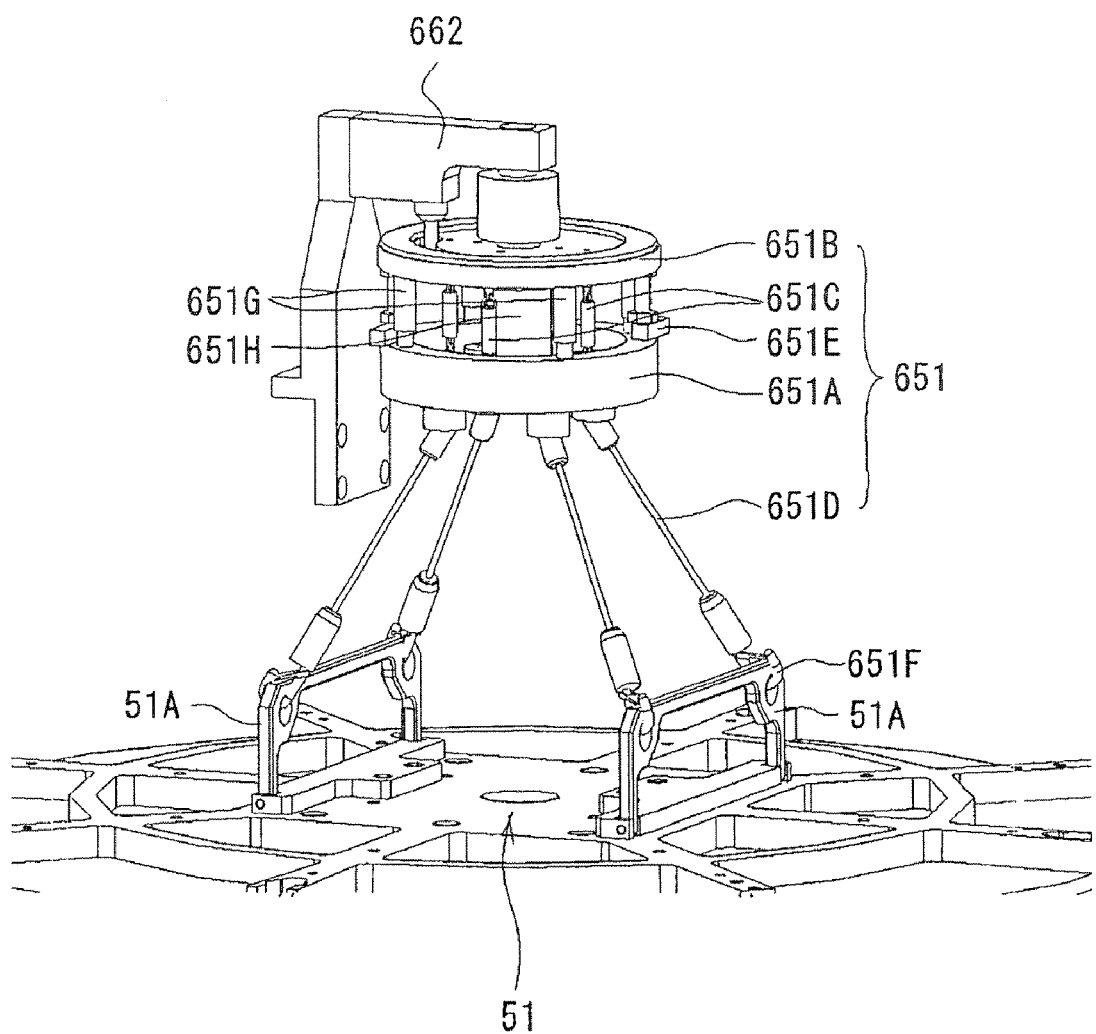
FIG. 12 is a perspective view showing an enlarged portion of the probe card transfer assist apparatus shown in FIGS. 11A and 11B.
Figure 13A:
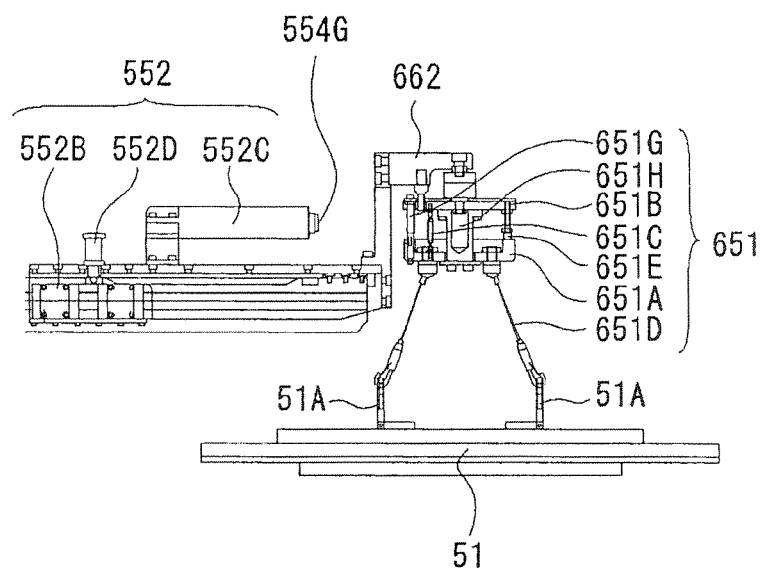
FIG. 13A is a side view showing a state of the probe card supported at a supporting portion of the probe card transfer assist apparatus shown in FIG. 12.
Figure 13B:
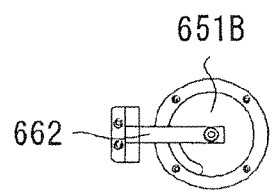
FIG. 13B is a top view of a second member.
Figure 13C:
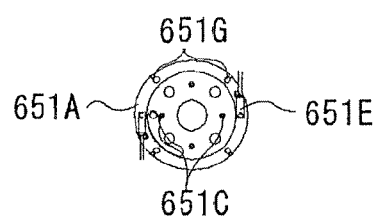
FIG. 13C is a top view of a first member.
Figure 14A:
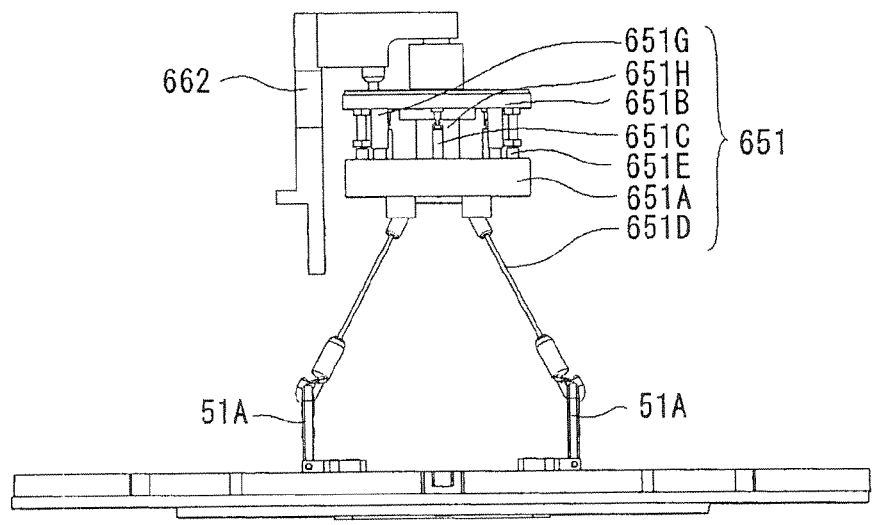
FIG. 14A is a side view illustrating a holding portion shown in FIG. 12.
Figure 14B:
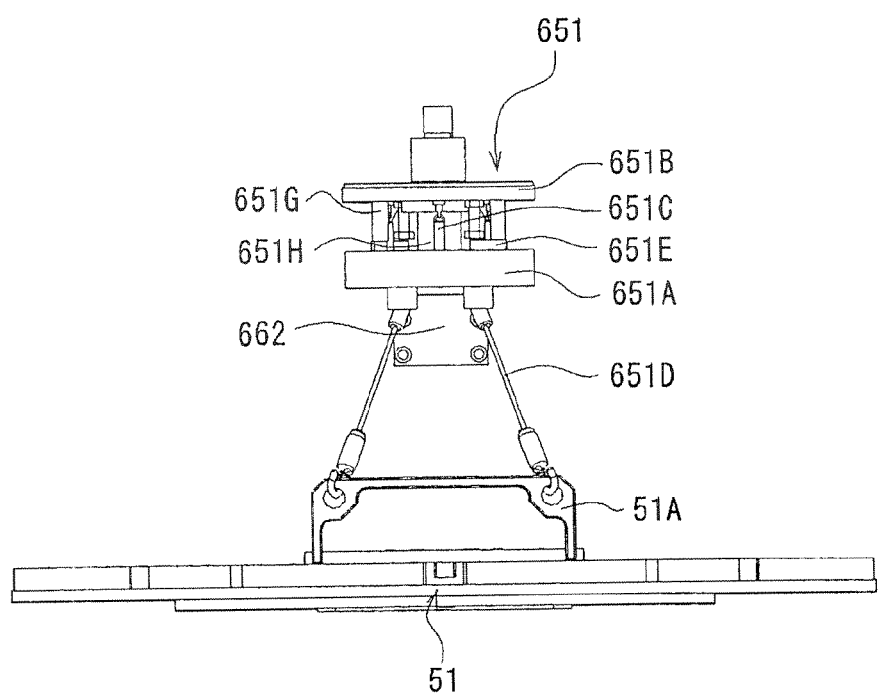
FIG. 14B is a front view thereof.
Figure 15:
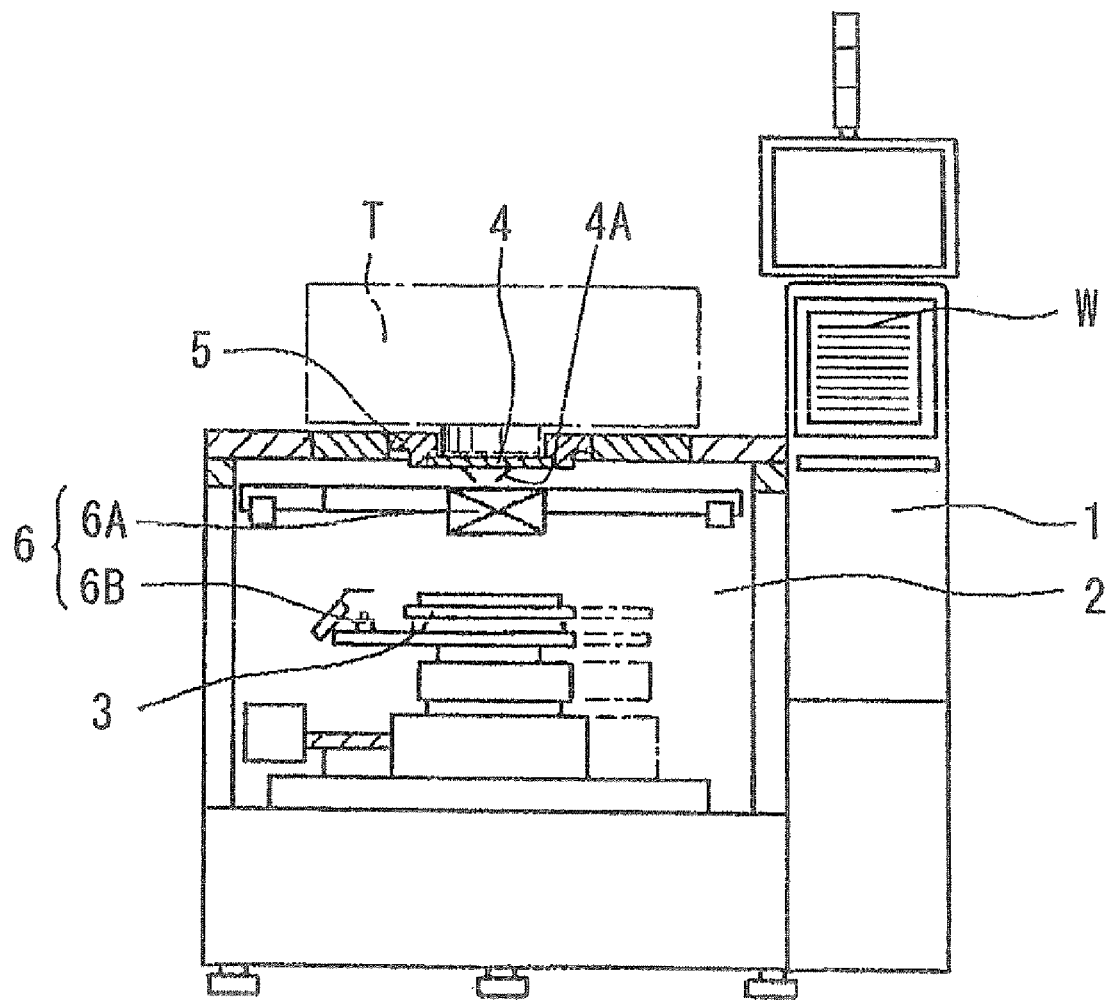
FIG. 15 is a partial cutaway front view of one example of a conventional inspecting apparatus.
Figure 16:
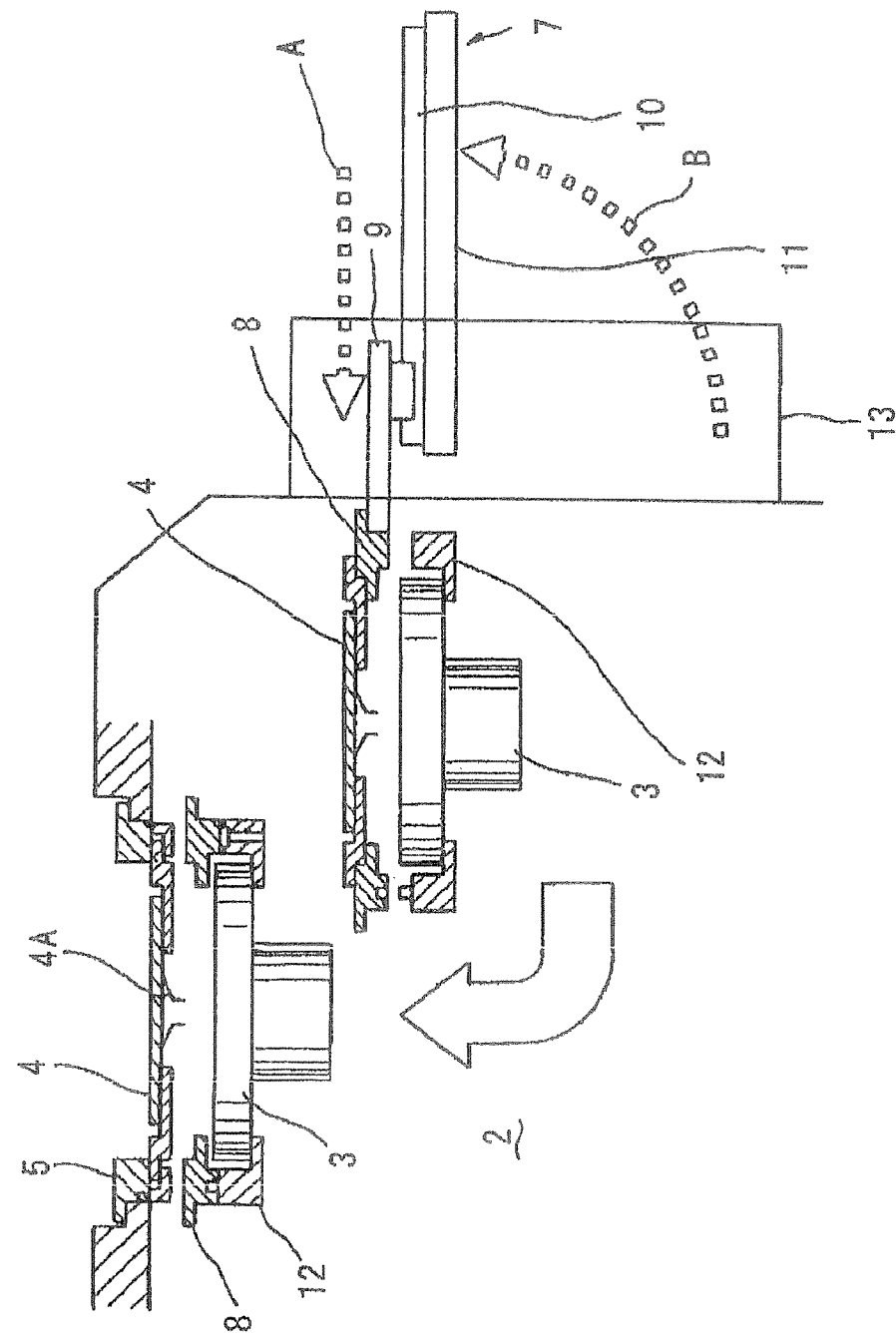
FIG. 16 is an explanatory view showing an operation of a probe card transfer apparatus employed in the inspecting apparatus shown in FIG. 15.

As shown in FIGS. 12 to 13C, the spring members 651C are disposed, each being separated from a neighboring one by an equal space in a circumferential direction along an inner sidewall of the first member 651A and is configured to connect the first and the second member 651A and 651B. Also, a plurality (there are four in the present embodiment) of extensible and contractible devices 651G is disposed, each being separated from a next one by in a circumferential direction at an upper surface of the first member 651A sidewall, and the extensible and contractible devices 651G are configured to connect the first and the second member 651A and 651B in a manner capable of being moved up and down The extensible and contractible devices 651G are formed with, for example, a rod installed at the sidewall of the first member 651A vertically and a dry bushing which is extended downwardly in a vertical manner at the second member 651B and is in synchronization with the extending and contracting of the spring members 651C, thereby allowing the rod to move upwardly and downwardly within the dry bushing. The four spring members 651C and the four extensible and contractible devices 651G are disposed, as shown in FIG. 13C, each being separated from a next one by an angular distance of 45 degrees.

As shown in FIGS. 12 and 13A, a columnar shaped elevation guide 651H is configured to be, for example, extensible vertically from a middle of the second member 651B and is further configured to pass through a hole formed at a middle of the first member 651A. Since a flange is formed at a lower end of the elevation guide 651H, the first member 651A descending due to the weight of the probe card 51 is configured to be engaged with this flange.

Further, the two card detecting sensors 651E are disposed as shown in FIGS. 12 and 13B, being separated by an angular difference of 180 degrees between them at an upper surface of the sidewall of the first member 651A. These card detecting sensors 651E are configured to detect whether or not the probe card 51 is supported based on the variances of the distances between the first and the second member 651A and 651B when the first member 651A is descended due to the weight of the probe card 51 along the elevation guide 651H while resisting against the spring force of the spring members 651C. The card detecting sensors 651E are electrically connected to the controller of the elevation driving unit 554 as will be discussed later. Also, although the card detecting sensors 651E are provided at the first member 651A, it may also be provided at the second member 651B. In addition, as for the card detecting sensors 651E, optical sensors can also be used instead of the capacitance sensors.

The elevation driving unit 554 includes the maneuvering switch (see FIG. 7) 554G which operates when the maneuvering handle 552C is gripped for maneuvering thereof, and as will be discussed later, the maneuvering switch 554G is configured to control an opening and a closing of the electromagnetic valve 554C and the electro-pneumatic regulator 554D by collaborating with the card detecting sensors 651H. That is, the card detecting sensors 651H and the maneuvering switch 554G are electrically connected to the input terminal 554E through the controller 554H. Further, when the card detecting sensors 651H and the maneuvering switch 554G are both on, the electro-pneumatic regulator 554D is operated based on the input value from the input terminal 554E with the controller 554H and at the same time, the electromagnetic valve 554C is turned open.

Also, when the card detecting sensors 651H and the maneuvering switch 554G are both on, the controller 554H controls to make the electromagnetic valve 554C open, and the compressed air is supplied to the air cylinder 554A via the electro-pneumatic regulator 554D. However, if any one of the card detecting sensors 651H and the maneuvering switch 554G is off, the controller 554J controls to make the electromagnetic valve 554C be closed and the compressed air gets sealed within the air cylinder 554A. Further, the operation of the air cylinder 554A is stopped, and the arm 552 is stopped during the course of descending. For example, there could be a case where a weight of the probe card 51 is larger than an inputted weight from the input terminal 554E. Given this circumstance, while the arm 552 being rotated by maneuvering the maneuvering handle 552C, an upthrust force from the air cylinder 554A is not strong enough to over the gravitation and the arm starts to descend.

At this time, if an operator, who is unaware of the error in the input value, decides to release the maneuvering handle 552C, the maneuvering switch 554G is turned off, thereby closing the electromagnetic valve 554C, and the compressed air supplied to the air cylinder 554A up to that time gets sealed within the air cylinder 554A. Consequently, because the arm 552 gets lowered due to its self-gravity weight of the probe card 51 to thereby increase the inner pre ssure in the compressed air sealed thereof, the arm 552 is stopped, thereby preventing further descending of the probe card 51. Also, in case a weight of the probe card 51 is set too small at the input terminal 554E, a sudden elevation of the air cylinder 554A can be prevented in a manner similar to the above-mentioned case, by releasing the maneuvering handle 552C from hands of an operator. In addition, the reference numeral 554I in FIG. 7 is a mist separator.

Operation procedures will be described hereinafter. When placing or replacing the probe cards 51 at the inspection apparatuses 52 of the inspection equipment 50, an operator takes out a specific number of the probe cards 51 from the maintenance shelf and loads the probe cards 51 into the transfer vehicle 54 along with the trays. Further, as shown in FIG. 1, the probe cards 51 are transferred to a designated inspection apparatus 52 via the transfer vehicle 54 by the operator.

While maintaining the probe cards 51 received along with the trays on the shelves of the transfer vehicle 54, the operator first removes a probe card 51 from the transfer vehicle 54 and then moves it to a top surface of the transfer vehicle 54. Only the probe card 51 is then transferred to the inspection apparatus 52 by employing the probe card transfer assist apparatus 55. Here, in case of using the probe card transfer assist apparatus 55, a weight of the probe card 51 is determined and inputted in advance by using the input terminal 554E of the elevation driving unit 554. Next, the arm 552 is raised and the arm 552 is maintained at a horizontal state by engaging an engaging member 558 onto a second pin 557A. At this state, the arm 552 is rotated directly above the probe card 51 by manipulating the maneuvering handle 651H. Further, the holder 651 is set to be in alignment with the center of the probe card 51.

By pushing downwardly the holder 651F with the maneuvering handle 552C, the hooks 651F of the wires 651D are made to be engaged with the holes of the grips 51A. At this sate, after setting up the grips 51A and 51A of the probe card 51, the hooks 651F of the four wires 651D are engaged onto the respective holes of a pair of the grips 51A and 51A. Further, when the operator turns on the maneuvering switch 554G, the pressure sensor detects a normal pressure of the compressed air, which in turn, opens the electromagnetic valve 554C. Therefore, the compressed air of a predetermined pressure is supplied within the air cylinder 554A under the control of the electro-pneumatic regulator 554D based on the value of inputted weight of the probe card 51.

Consequently, the arm 552 and the holder 651 are elevated to thereby extend the wires 651D, resulting in getting rid of any slack in the wires 651D. Further, when the arm 552 is elevated, the second member 651B of the holder 651 is elevated against an opposing spring force from the spring members 651C, and when the distance from the second member 651B to the first member 651A is varied, the card detecting sensors 651E are driven, thereby detecting the probe card 51. In this way, a supplement force needed to lift the probe card 51 from the shelf of the transfer vehicle 54 is provided. Accordingly, the second member 651B gets elevated, and when the flange of the elevation guide 651H reaches the first member 651A, the probe card 51 is lifted from the shelf of the transfer vehicle 54. At this state, the operator rotates the arm 552 toward the inspection apparatus 52 by maneuvering the maneuvering handle 552C to thereby transfer the probe card 51 directly above the card transfer unit 52B of the inspection apparatus 52.

By pushing down the maneuvering handle 552C from directly above the card transfer unit 52B after turning off the maneuvering switch 554G, the probe card 51 is put down on the card transfer unit 52B. Next, the hooks 651F of the wires 651D are removed from the grips 51A and 51A, thereby freeing up the probe card 51 from the holder 651. The transfer of the probe card 51 is, therefore, completed.

Further, for transferring the probe cards 51 from the inspection apparatuses 52 to the transfer vehicle 54, the probe card transfer assist apparatuses 55 can be employed in the order described hereinbefore. Consequently, the transfer of the probe cards 51 can be carried out with ease.

In accordance with the aforementioned embodiment of the present invention, the inspection equipment 50 includes the inspection apparatus 52 (only one is illustrated in FIG. 1) employing the probe card 51 for performing an electrical characteristics inspection of a wafer; the transfer vehicle 54 for transferring the probe card 51 along the passageway 53 where a plurality of the inspection apparatuses 52 is placed; and the probe card transfer assist apparatus 55 which is adapted to assist an operation of transferring of the probe card 51 between the transfer vehicle 54 and the card transfer unit 52B disposed at the apparatus main body 52A of the illustrated inspection apparatus 52, the apparatus main body 52A of each inspection apparatus 52 being provided with one card transfer unit 52B.

Further, the probe card transfer assist apparatus 55 includes the holder 651 which holds the probe card 51 by holding onto its grips 51A; the extensible and contractible arm 552 disposed at an end portion of the holder 651; the supporting unit 553 capable of freely rotating while supporting the arm 552; and the elevation driving unit 554 which moves the probe card 51 up and down with the above supporting unit 553 in accordance with the weight of the probe card 51. Accordingly, by supporting the probe card 51 with the wires 651D of the holder 651, lifting the arm 552 with the elevation driving unit 554 from the transfer vehicle 54 or from the card transfer unit 52B of the inspection apparatus 52, and rotating the arm 552 by maneuvering the maneuvering handle 552C, the operator can transfer the probe card 51 between the transfer vehicle 54 and the card transfer unit 52B of the inspection apparatus 52 without having to do a hard labor, thereby reducing a burden of operator significantly.

In addition, since the holder 651 of the present embodiment includes the circular shaped first member 651A; the circular shaped second member 651B disposed above a center of the first member 651A and formed with an approximately same diameter of the first member 651A; the spring members 651C for connecting the first member 651A to the second member 651B while allowing the first member 651A to be moved up and down; the four wires 651D attached at a lower surface of the first member 651A; and the card detecting sensors 651E for detecting the change in the distance between the first and the second member 651A and 651B, the card detecting sensors 651E detect whether the probe card 51 is held by the holder 651. Further, the elevation driving unit 554 provides the supplement force needed to lift the probe card 51 to the arm 552 based on a detection signal from both the card detecting sensors 651E and the maneuvering switch 554G.

Further, since the arm 552 is rotated about the rotational body 560 while it is in a contracted state, it is possible to minimize the moving range of the arm 552 that can be given by a leading portion of the arm 552 centered at the base end of the arm 552. Consequently, although it may be impossible to dispose the transfer vehicle 54 between the small gaps, a space for the arms 552 to rotate from the transfer vehicle 54 disposed along the passageway 53 to a side of the inspection apparatus 52 can be obtained. At the same time, a space sufficiently large enough for the operator to enter and exit can also be secured.

Also, the elevation driving unit 554 includes the maneuvering switch 554G for maneuvering the arm 552. Further, the card detecting sensor 551E, the maneuvering switch 554G and the pressure sensor 554F communicate with each other to open and close the electromagnetic valve 554C. Therefore, if the maneuvering handle 552C is let go from the hands of the operator, the maneuvering switch 554G is automatically turned off, which in turn, closes the electromagnetic valve 554C, thereby restricting a gravitational descending of the arm 552 due to the weight of the probe card 51. This prevents the probe card 51 from being damaged.

The case of transferring the probe cards as a group is discussed in each of the embodiments; however, it is not necessary to illustrate that the card holder attached probe cards can also be transferred in the identical manner. Therefore, the present invention is not limited to the aforementioned embodiments, and each element can be modified, if necessary.

The present invention can be suitably used in an inspection equipment where a plurality of inspection apparatuses employing probe cards are disposed.

While the invention has been shown and described with respect to the preferred embodiments, it will be understood by those skilled in the art that various changes and modification may be made without departing from the scope of the invention as defined in the following claims.

What is claimed is:

1. A probe card transfer assist apparatus for assisting an operation of transferring a probe card employed in an electrical inspection apparatus, the probe card transfer assist apparatus comprising:
a holding unit for holding a pair of grips of the probe card wherein the grips are supported by being placed onto the holding unit;
a supporting unit for movably supporting the holding unit; and
an elevation mechanism for moving the supporting unit up and down,
wherein the holding unit includes a first plate member having grooves for placing therein the grips; a second plate member disposed above the first plate member and for holding the first plate member while allowing the first plate member to be moved up and down; and a sensor for detecting a change of a distance between the first and the second plate member.

2. The probe card transfer assist apparatus according to claim 1, wherein the holding unit further includes levers, each of the levers being attached to one of end portions of the first plate member next to each of the grooves and being allowed to be raised and folded, and
wherein the levers are raised for preventing a release of the grips from the holding unit.

3. The probe card transfer assist apparatus according to claim 1, wherein the holding unit further includes flexible members for preventing a release of the grips from the holding unit, each of the flexible members being attached at one of end portions of the first plate member next to each of the grooves to be protruded above the grooves.

4. The probe card transfer assist apparatus according to claim 1, wherein the holding unit is attached to an extensible and contractible arm protruded from the supporting unit.

5. The probe card transfer assist apparatus according to claim 4, wherein the arm is provided with an elevation unit for moving the holding unit up and down.

6. The probe card transfer assist apparatus according to claim 4, wherein the elevation mechanism for the supporting unit includes:
a cylinder device for moving the arm up and down;
a valve for opening and closing a line supplying a driving fluid to the cylinder device;
a pressure sensor for detecting a pressure of the driving fluid;
a regulator for controlling the pressure of the driving fluid; and
an input terminal for inputting in advance a weight of the probe card for the regulator to control the pressure of the driving fluid according to the weight.

7. The probe card transfer assist apparatus according to claim 1, wherein the elevation mechanism for the supporting unit is configured to provide a supplementary force in a direction where the probe card is moved upwardly.

8. The probe card transfer assist apparatus according to claim 7, wherein the supplementary force is configured to be varied according to the weight of the probe card.

9. The probe card transfer assist apparatus according to claim 1, wherein the probe card transfer assist apparatus is disposed at the inspection apparatus.

10. The probe card transfer assist apparatus according to claim 1, wherein the probe card transfer assist apparatus is located between the inspection apparatus and a transfer unit for transferring the probe card to and from the inspection apparatus, when assisting the operation of transferring the probe card between the inspection apparatus and the transfer unit.

11. The probe card transfer assist apparatus according to claim 10, wherein the transfer unit is a transfer vehicle.

12. A probe card transfer assist apparatus for assisting an operation of transferring a probe card employed in an electrical inspection apparatus, the probe card transfer assist apparatus comprising:
a holding unit comprising wire members for holding a pair of grips of the probe card;
a supporting unit for movably supporting the holding unit; and
an elevation mechanism for moving the supporting unit up and down,
wherein the grips are suspended from the holding unit by the wire members.

13. The probe card transfer assist apparatus according to claim 12, wherein the holding unit includes a first member having the wire members attached thereto, a second member disposed above the first member and for holding the first member while allowing the first member to be moved up and down, and a sensor for detecting a change of a distance between the first and the second members.

14. An inspecting equipment comprising a probe card transfer assist apparatus for assisting an operation of transferring a probe card employed in an electrical inspection apparatus, the probe card transfer assist apparatus comprising:
- a holding unit for holding a pair of grips of the probe card wherein the grips are supported by being placed onto the holding unit;
- a supporting unit for movably supporting the holding unit; and
- an elevation mechanism for moving the supporting unit up and down,
- wherein the holding unit further includes a first plate member having grooves for placing therein the grips; a second plate member disposed above the first plate member and for holding the first plate member while allowing the first plate member to be moved up and down; and a sensor for detecting a change of a distance between the first and the second plate member.

15. The inspecting equipment according to claim 14, wherein the holding unit includes further levers, each of the levers being attached at one of end portions of the first plate member next to each of the grooves and being allowed to be raised and folded, and
- wherein the levers are raised for preventing a release of the grips from the holding unit.

16. The inspecting equipment according to claim 14, wherein the holding unit further includes flexible members for preventing release of the grips from the holding unit, each of the flexible members being attached at one of end portions of the first plate member next to each of the grooves to be protruded above the grooves.

17. The inspecting equipment according to claim 14, wherein the holding unit is attached to an extensible and contractible arm protruded from the supporting unit.

18. The inspecting equipment according to claim 17, wherein the arm is provided with an elevation unit for moving the holding unit up and down.

19. The inspecting equipment according to claim 14, wherein the elevation mechanism for the supporting unit includes:
- a cylinder device for moving the arm up and down;
- a valve for opening and closing a line supplying a driving fluid to the cylinder device;
- a pressure sensor for detecting a pressure of the driving fluid;
- a regulator for controlling the pressure of the driving fluid; and
- an input terminal for inputting in advance a weight of the probe card for the regulator to control the pressure of the driving fluid according to the weight.

20. The inspecting equipment according to claim 14, wherein the elevation mechanism for the supporting unit is configured to provide a supplementary force in a direction where the probe card is moved upwardly.

21. The inspecting equipment according to claim 20, wherein the supplementary force is configured to be varied according to the weight of the probe card.

22. The inspecting equipment according to claim 14, wherein the probe card transfer assist apparatus is disposed at the inspection apparatus.

23. The inspecting equipment according to claim 14, wherein the probe card transfer assist apparatus is located between the inspection apparatus and a transfer unit for transferring the probe card to and from the inspection apparatus, when assisting the operation of transferring the probe card between the inspection apparatus and the transfer unit.

24. The inspecting equipment according to claim 23, wherein the transfer unit is a transfer vehicle.

25. An inspecting equipment comprising a probe card transfer assist apparatus for assisting an operation of transferring a probe card employed in an electrical inspection apparatus, the probe card transfer assist apparatus comprising:
- a holding unit comprising wire members for holding a pair of grips of the probe card;
- a supporting unit for movably supporting the holding unit; and
- an elevation mechanism for moving the supporting unit up and down,
- wherein the grips are suspended from the holding unit by wire members.

26. The inspecting equipment according to claim 25, wherein the holding unit includes a first member having the wire members attached thereto, a second member disposed above the first member and for holding the first member while allowing the first member to be moved up and down, and a sensor for detecting a change of a distance between the first and the second members.

* * * * *